United States Patent
Yang et al.

(10) Patent No.: US 10,468,111 B1
(45) Date of Patent: Nov. 5, 2019

(54) ASYMMETRIC VOLTAGE RAMP RATE CONTROL

(71) Applicant: SanDisk Technologies LLC, Plano, TX (US)

(72) Inventors: Xiang Yang, Santa Clara, CA (US); Huai-Yuan Tseng, San Ramon, CA (US); Deepanshu Dutta, Fremont, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/967,270

(22) Filed: Apr. 30, 2018

(51) Int. Cl.
*G11C 7/00* (2006.01)
*G11C 16/34* (2006.01)
*G11C 16/04* (2006.01)
*G11C 16/26* (2006.01)
G11C 16/10 (2006.01)
G11C 11/56 (2006.01)

(52) U.S. Cl.
CPC ...... *G11C 16/3427* (2013.01); *G11C 16/0483* (2013.01); *G11C 16/26* (2013.01); *G11C 11/5642* (2013.01); *G11C 11/5671* (2013.01); *G11C 16/10* (2013.01)

(58) Field of Classification Search
CPC ......... G11C 16/10; G11C 16/30; G11C 16/12; G11C 16/0483; H01L 27/115
USPC ............................................. 365/203, 185.19
See application file for complete search history.

(56) References Cited

U.S. PATENT DOCUMENTS

| | | | |
|---|---|---|---|
| 5,751,635 A | 5/1998 | Wong et al. | |
| 7,349,258 B2 | 3/2008 | Fong et al. | |
| 7,436,709 B2 | 10/2008 | Higashitani | |
| 7,440,318 B2 | 10/2008 | Fong et al. | |
| 7,447,086 B2 | 11/2008 | Wan et al. | |
| 8,289,779 B2 | 10/2012 | Hoei | |
| 9,412,463 B1 | 8/2016 | Chen et al. | |
| 9,466,369 B1 | 10/2016 | Pang et al. | |
| 9,496,038 B1 | 11/2016 | Kwak et al. | |
| 9,543,027 B2 | 1/2017 | Nagashima | |
| 9,640,273 B1 | 5/2017 | Chen et al. | |
| 9,671,968 B2 | 6/2017 | Kasorla et al. | |
| 9,761,320 B1 | 9/2017 | Chen et al. | |
| 9,887,002 B1 | 2/2018 | Zhang et al. | |
| 2008/0019180 A1 | 1/2008 | Wan et al. | |
| 2010/0110798 A1* | 5/2010 | Hoei ..................... | G11C 5/063 365/185.24 |
| 2016/0293264 A1* | 10/2016 | Al-Shamma .......... | G11C 16/30 |
| 2017/0178736 A1 | 6/2017 | Yang et al. | |

* cited by examiner

*Primary Examiner* — Son T Dinh
(74) *Attorney, Agent, or Firm* — Foley & Lardner LLP

(57) ABSTRACT

Systems and methods reduce device peak current during a read operation by charging control lines of a first set of memory cells faster than control lines of a second set of memory cells while minimizing the channel gradient formed adjacent to a selected word line to suppress occurrences of an injection read disturb in a sense line channel. For example, a first set of memory cells are in a first location relative to a selected memory cell selected for sensing, and a second set of memory cells are in a second location relative to the selected memory cell. The charge device is configured to charge the first set of memory cells and the second set of memory cells. In some aspects, a rate of charging the first set of memory cells is different from a rate of charging the second set of memory cells.

20 Claims, 17 Drawing Sheets

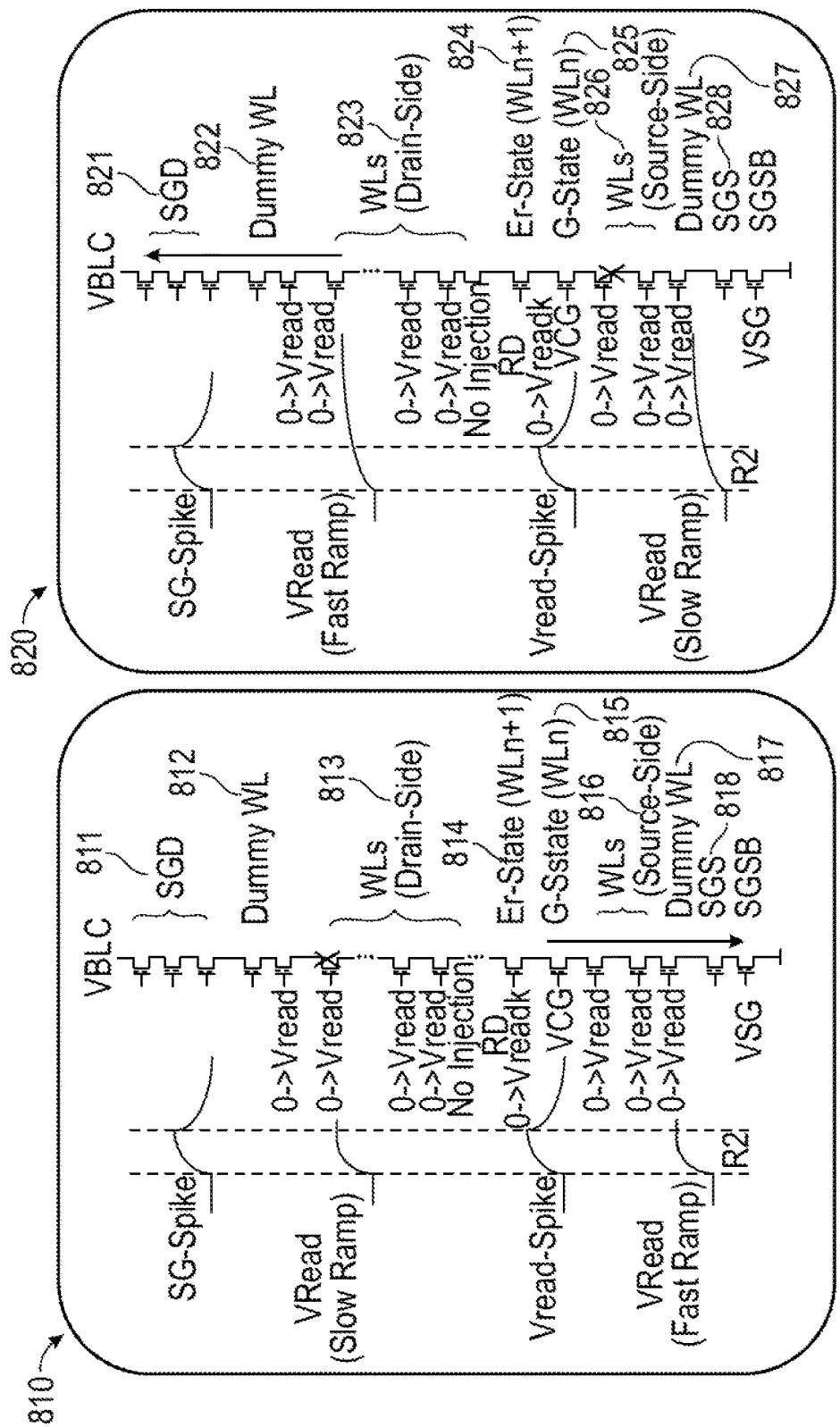

US 10,468,111 B1

ASYMMETRIC VOLTAGE RAMP RATE CONTROL

BACKGROUND

The present description relates generally to data storage devices and methods, including, without limitation, asymmetric voltage ramp rate control.

Flash memory enjoys a number of advantages over other types of storage devices. Flash memory generally offers faster read access times and better shock resistance than a hard disk drive (HDD). Unlike dynamic random access memory (DRAM), flash memory is non-volatile, meaning that data stored in a flash storage device is not lost when power to the device is removed. These advantages, and others, may explain the increasing popularity of flash memory for storage applications in devices such as memory cards, USB flash drives, mobile phones, digital cameras, mass storage devices, MP3 players and the like.

Flash memory utilizes memory cells (e.g., single-level cells (SLC), multi-level cells (MLC), triple-level cells (TLC) and/or quad-level cells (QLC)) to store data as electrical values, such as electrical charges or voltages. As flash memory continues to grow in storage density to meet increasing demand for data storage, flash memory designs have continued to grow in complexity to adapt to the expected reliability and endurance of MLC, TLC, QLC, and even higher density memory cells. The value of the device peak current during storage operations in flash memory is an important metric for power management of flash memory.

BRIEF DESCRIPTION OF THE DRAWINGS

Certain features of the subject technology are set forth in the appended claims. However, for purpose of explanation, several embodiments of the subject technology are set forth in the following figures.

FIG. 8A illustrates an example of a NAND string with word lines collectively ramped up to a read voltage during a read operation with ramp rate control enabled to a first subset of memory cells of the NAND string in accordance with one or more implementations of the subject technology.

FIG. 8B illustrates an example of a NAND string with word lines collectively ramped up to a read voltage during a read operation with ramp rate control enabled to a second subset of memory cells of the NAND string in accordance with one or more implementations of the subject technology.

DETAILED DESCRIPTION

Figure 1A:
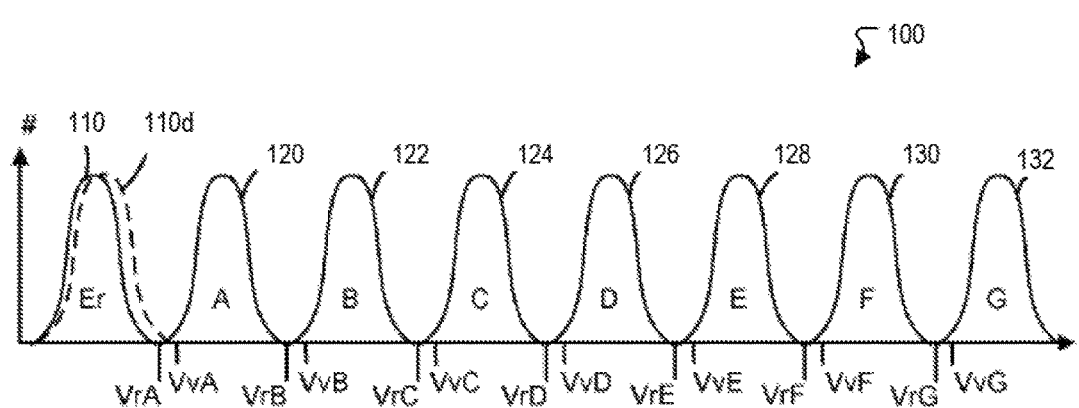
FIG. 1A illustrates an example of a threshold voltage distribution found in a multi-level flash memory cell over time in accordance with one or more implementations.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block diagram form in order to avoid obscuring the concepts of the subject technology.

Flash memory devices utilize memory cells (e.g., SLC, MLC, and/or TLC) to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage the charge creates, is used to represent one or more data values. In some implementations, during a read operation, a reading threshold voltage is applied to the control gate of the transistor and the resulting sensed current or voltage is mapped to a data value. In some implementations, a charge-storing material such as a charge-trapping material can be used in such memory devices to store a charge which represents a data state. The charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

In some flash memory devices, memory cells are joined to one another in an array, such as in NAND strings in a block or sub-block. Each NAND string includes a number of memory cells connected in series, including a first set of memory cells on a drain-side of the NAND string that is connected to a bit line, and a second set of memory cells on a source-side of the NAND string that is connected to a source line. The first set of memory cells may be coupled to one or more drain-side select gate transistors (SGD transistors). The second set of memory cells may be coupled to one or more source-side select gate transistors (SGS transistors). Further, the memory cells can be arranged with a common control line (e.g., word line) which acts as a control gate. A set of word lines extends from the source side of a block to the drain side of a block.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations. Verify operations may be performed after one or more programming passes to determine whether the memory cells have completed programming. Read operations may be performed as part of the verify operations and/or as separate reading operations with the memory cells.

Each memory cell may be associated with a data state according to write data in a program command. Based on its data state, a memory cell may either remain in the erased state or be programmed to a data state (a programmed data state) different from the erased state. For example, in a three-bit per cell memory device, there are eight data states including the erased state and seven higher data states referred to as the A, B, C, D, E, F and G data states (see FIG. 1A).

Peak current (e.g., $I_{CC}$ is a metric for flash memory devices, which is defined as the highest current level during a given storage operation. In some aspects, power management for the flash memory devices is highly gated by the peak current. In order to control the peak current, there is a device mode in flash memory generally referred to as "ramp rate control (RRC)." The RRC may be set to slow down word line ramp up rates, thus reducing the peak current in flash memory devices.

However, during these read operation voltages with slower ramp rates, a channel gradient that generates electron-hole pairs may be caused in a portion of a sense line channel formed of a channel layer material, e.g., polysilicon, that is between the selected word line and an adjacent word line. The electrons can travel as hot carriers into the charge-storing material of a memory cell and increase its threshold voltage (Vth). The channel gradient is a change in the potential in the sense line channel, which runs the length of the NAND string. As the magnitude of the change in the potential increases, the likelihood of an injection read disturb occurring in the sense line channel also increases. For example, this problem is more likely to occur when the memory cell on the selected word line has a threshold voltage that corresponds to the G state and the memory cell on the drain-side adjacent word line has a threshold voltage that corresponds to the Erase state, in which the channel gradient between these two memory cells may be significantly high.

One or more aspects of the subject technology provide for reducing the device peak current during a read operation by charging word lines of a first set of memory cells faster than word lines of a second set of memory cells while minimizing the channel gradient formed adjacent to the selected word line to suppress the occurrence of an injection read disturb in the bit line channel.

In some implementations, an apparatus includes a first set of memory cells in a first location relative to a selected memory cell selected for sensing. The apparatus also includes a second set of memory cells in a second location relative to the selected memory cell. The apparatus also includes a sense line channel configured to couple the selected memory cell to the first set of memory cells and the second set of memory cells. The apparatus also includes a charge device that is configured to charge the first set of memory cells and the second set of memory cells. In some aspects, a rate of charging the first set of memory cells is different from a rate of charging the second set of memory cells.

The higher ramp rates of the voltages on unselected word lines for a first region of the array (having the lesser amount of memory cells) can enable the bit line channel to conduct from either the source side or drain side with respect to the selected word line. The lower ramp rates of the voltages on unselected word lines for a second region of the array (having the greater amount of memory cells) can help lower the amount of peak current generated during a pre-read cycle (e.g., a read preparation time prior to any cell reading). Although the portion of the bit line channel co-located with the memory cells charged with the lower ramp rates would not conduct, the change in potential between the selected word line and the adjacent word lines would not be sufficient to cause an injection read disturb occurrence. In particular, a lower ramp rate can suppress read disturb occurrences because hot carrier generation is more severe if the pre-read charging potential (e.g., VREAD) is increased too quickly. If the ramp rate is lower, the hot carriers have a better chance to be consumed by the pre-read charging potential, reducing the amount of hot carriers that are available to cause a read disturb.

In one or more implementations, the term "selected memory cell" may refer to a memory cell that is selected for a sensing operation, such as a read operation or a program verify operation. A selected memory cell may comprise one or more sides such as a drain side and a source side. In one or more examples, being in a first location relative to a selected memory cell may include being on a first side of a selected memory cell. In one or more examples, a first location relative to a selected memory cell may be a first area coupled to a selected memory cell. In one or more examples, a first location relative to a selected memory cell may be a location between the selected memory cell and a bit line. In one or more examples, a first location relative to a selected memory cell may include an area along a NAND string between a selected memory cell and an SGD. In one or more examples, being in a second location relative to a selected memory cell may include being on a second side (e.g., a side different from the first side) of a selected memory cell. In one or more examples, a second location relative to a selected memory cell may be a second area (e.g., an area different from the first area) coupled to a selected memory cell. In one or more examples, a second location relative to a selected memory cell may be a location between the selected memory cell and a source line. In one or more examples, a second location relative to a selected memory cell may include an area along a NAND string between a selected memory cell and an SGS. In one or more examples, a first location relative to a selected memory cell may be different from a second location relative to a selected memory cell.

In one or more implementations, the term "sense line channel" may refer to a structure (e.g., an annular structure) connected to a sensing output. In one or more aspects, a sense line channel may be configured to conduct current between a bit line and a source line. In one or more examples, a sense line channel may be formed of a channel layer material (e.g., undoped polysilicon). In one or more examples, a sense line channel may be a structure orthogonal to control gate lines (e.g., word lines). In one or more examples, a sense line channel may be arranged along a first axis, along a second axis orthogonal to the first axis, or along a third axis orthogonal to the first and second axes, depending on implementation without departing from the scope of the present disclosure.

In one or more implementations, a sense line channel may include a channel portion in a first location relative to a selected memory cell and a channel portion in a second location relative to the selected memory cell. In one or more examples, a channel portion in the first location may refer to a portion of a sense line channel that is part of a set of memory cells, where a set may include a single memory cell or multiple memory cells. In one or more examples, a channel portion in the first location may be a portion of the sense line channel between the selected memory cell and a bit line. In one or more examples, a channel portion in the second location may refer to a portion of a sense line channel that is part of another set of memory cells. In one or more examples, a channel portion in the second location may be a portion of the sense line channel between the selected memory cell and a source line. In one or more aspects, a channel portion in the first location is different from a channel portion in the second location. In one or more aspects, a set of memory cells associated with a channel portion in the first location is different from a set of memory cells associated with a channel portion in the second location.

In one or more implementations, a first portion of the sense line channel may be in a first location relative to a selected memory cell. In one or more implementations, a second portion of the sense line channel may be in a second location relative to a selected memory cell.

In one or more implementations, the terms "cell voltage" and "memory cell voltage," in the context of flash memory cells, may refer to a threshold voltage of the memory cell, which is the minimum voltage that needs to be driven to the gate of the memory cell's transistor in order for the transistor to conduct current. Similarly, read voltages to flash memory cells are gate voltages applied to the gates of the flash memory cells to determine whether the memory cells conduct current at that gate voltage. In some implementations, when a flash memory cell's transistor conducts current at a given read voltage, indicating that the cell voltage is less than the read voltage, the raw data value for that read operation is a "1" and otherwise the raw data value is a "0."

In one or more implementations, the term "magnitude" may refer to an absolute value of a voltage potential. In one or more implementations, the term "rate of charging" may refer to a measure of a rate at which a memory cell is charged relative to a target voltage.

FIG. 1A illustrates an example of voltage distributions 100 found in multi-level flash memory cells over time in accordance with one or more implementations. The voltage distributions 100 shown in FIG. 1A have been simplified for illustrative purposes. The cell voltage of a MLC approximately extends from a voltage, VSS, at the source terminal of a NMOS transistor to a voltage, VDD, at the drain terminal. As such, the voltage distributions 100 can extend between VSS and VDD.

The set of memory cells associated with the voltage distributions 100 are connected to a word line, after a programming operation, where eight data states are used. A Vth distribution 110 is provided for erased (Er) state memory cells. Vth distributions 120, 122, 124, 126, 128, 130 and 132 represent assigned data states A, B, C, D, E, F and G, respectively, which are reached by memory cells when their threshold voltage (Vth) exceeds program verify voltages VvA, VvB, VvC, VvD, VvE, VvF or VvG, respectively. Read voltages VrA, VrB, VrC, VrD, VrE, VrF and VrG are used to read data from a set of cells having this Vth distribution. A Vth distribution 110d represents the erased state cells after they experience a read disturb (or an injection read disturb).

With eight data states, or three bits per cell, three pages of data can be stored. An example encoding of bits for the A, B, C, D, E, F and G states is 111, 110, 100, 000, 010, 011, 001 and 101, respectively. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

The read voltages VrA, VrB, VrC, VrD, VrE, VrF and VrG are positioned between adjacent center voltages (e.g., positioned at or near the halfway point between adjacent center voltages) and, thus, define threshold voltages between the voltage ranges 110, 120, 122, 124, 126, 128, 130 and 132. During a read operation, one of the read voltages VrA, VrB, VrC, VrD, VrE, VrF and VrG is applied to determine the cell voltage using a comparison process. However, due to the various factors discussed below (see FIGS. 1B, 1C, 1D), the actual cell voltage, and/or the cell voltage received when reading the MLC, may be different from a respective center voltage corresponding to the data value written into the cell. For example, the actual cell voltage may be in an altogether different voltage range, strongly indicating that the MLC is storing a different bit-tuple than was written to the MLC. More commonly, the actual cell voltage may be close to one of the read voltages, making it difficult to determine with certainty which of two adjacent bit-tuples is stored by the MLC.

Figure 1B:
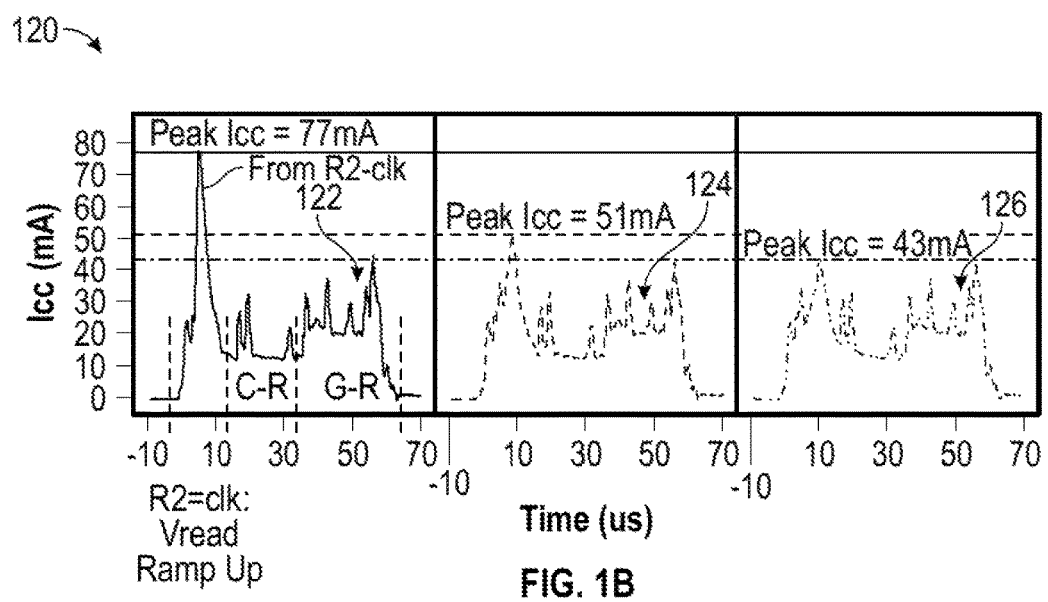
FIG. 1B illustrates an example of a waveform distribution depicting device current for different ramp rates during read operations in accordance with one or more implementations.

FIG. 1B illustrates an example of a waveform distribution 120 depicting device current for different ramp rates during read operations in accordance with one or more implementations. The waveform distribution 120 depicts the current consumption in a flash memory device for different sequences of read operations, where each sequence corresponds to a different ramp rate. As depicted in FIG. 1B, the waveform distribution 120 includes a first sequence 122, a second sequence 124, and a third sequence 126. The "ramp rate control" of the flash memory device may be adjusted to apply voltages with different ramp rates. For example, the first sequence 122 may be applied with a highest ramp rate, where the ramp rate control mode is disabled. The second sequence 124 may be applied with a middle ramp rate, where the ramp rate control mode may be set to a fraction of the default setting (e.g., 0.7X). The third sequence 126 may be applied with the lowest ramp rate, where the ramp rate control mode may be set to the default setting (e.g., 1X). Each of the sequences (e.g., 122, 124, 126) includes different read cycles over time (e.g., R2, CR, GR), where R2 refers to the pre-read cycle, CR refers to a read operation of a memory cell in a C state, and GR refers to a read operation of a memory cell in a G state.

During a read operation, the peak current typically occurs in the R2 cycle, when all word lines are collectively ramped up to the pre-read charging potential (e.g., VREAD), which may be set to 8V. In order to control the peak current, the ramp rate control is used to slow down all of the word line ramp up rates and allows a charge pump (e.g., pump that drives the pre-read charging potential) to generate less current per unit time, thus reducing the peak current during the R2 cycle.

Figure 1C:
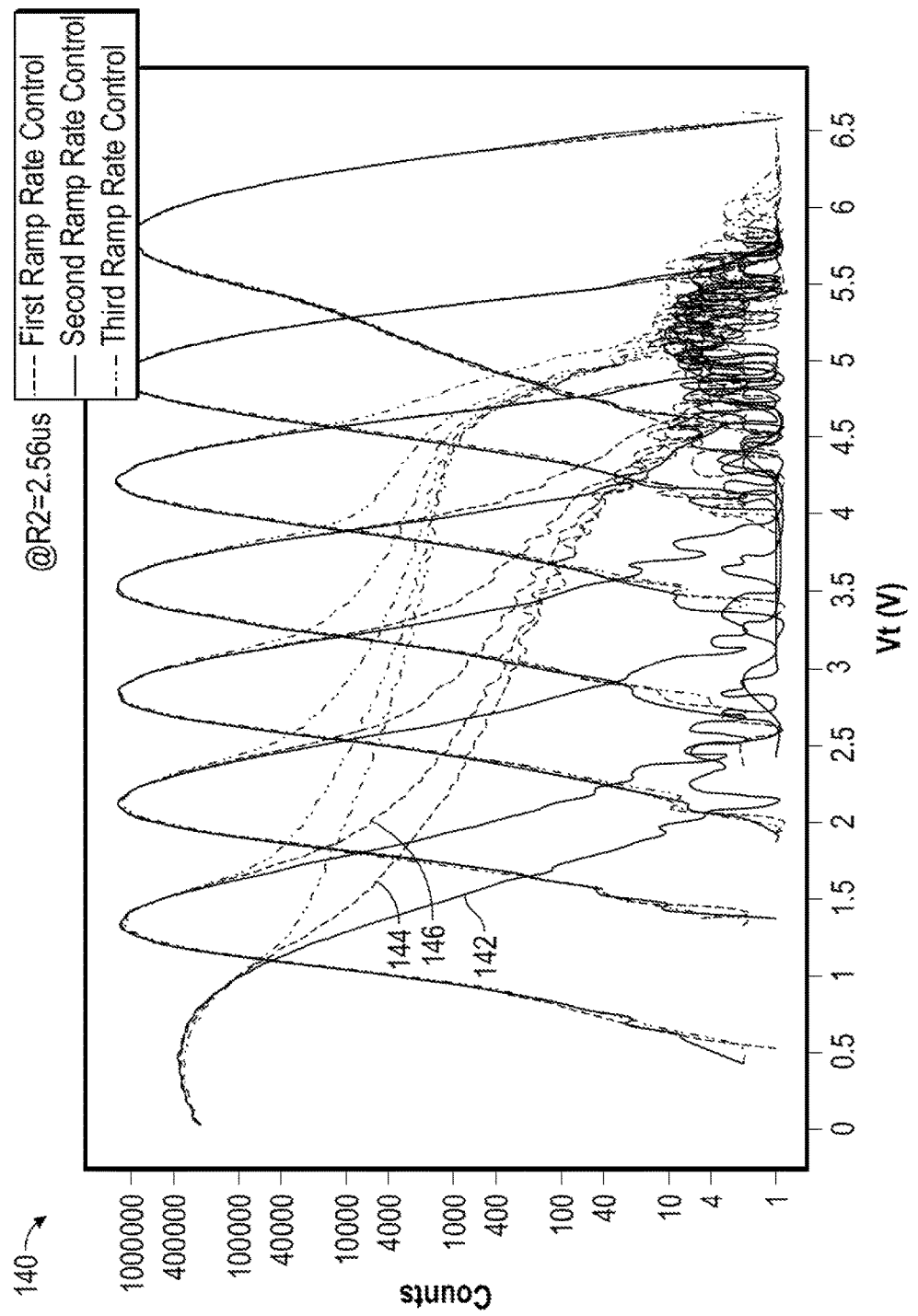
FIG. 1C illustrates an example of threshold voltage distributions with read disturb occurrences for different ramp rates in accordance with one or more implementations.

FIG. 1C illustrates an example of threshold voltage distributions 140 with read disturb occurrences for different ramp rates in accordance with one or more implementations. However, as shown in FIG. 1C, severe injection read disturb occurs, which significantly slows down read performance (e.g., by about 2.56 μs). For example, FIG. 1C depicts the threshold voltage distributions of MLC flash memory impacted by the read disturb occurrences after at least 100 k cell read counts at a fixed read period (e.g., at about 2.56 μs). The amount of cell voltage drift is more prevalent with memory cells with a lower threshold voltage that corresponds to the Erase (Er) state. As the threshold voltage increases, the cell voltage drifting begins to resemble a long drift tail at the higher threshold voltages. As shown in FIG. 1C, the drift tail is more prevalent in the waveform corresponding to the third ramp rate control 146 (e.g., the lowest ramp rate). The drift tail is almost non-existent in the waveform corresponding to the first ramp rate control 142 (e.g., the highest ramp rate). The drift tail is moderate in the waveform corresponding to the second ramp rate control 144.

Figure 1D:
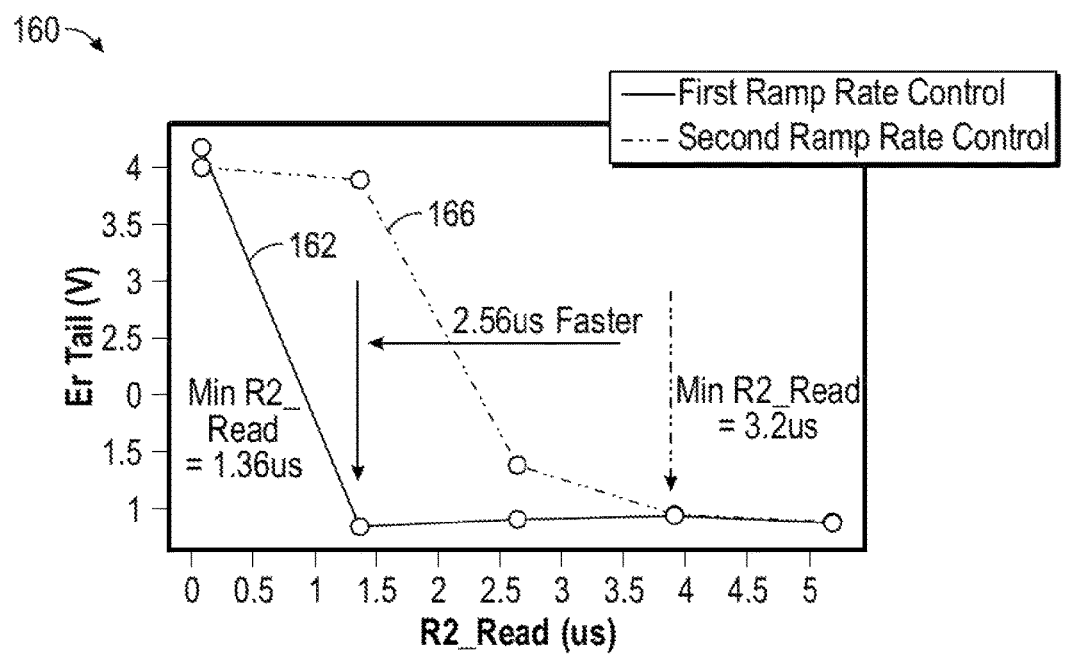
FIG. 1D illustrates an example of a plot depicting the potential magnitude of the erase state drift tail over read time in accordance with one or more implementations.

FIG. 1D illustrates an example of a plot 160 depicting the potential magnitude of the erase state drift tail over read time in accordance with one or more implementations. The plot 160 includes a first curve 162 corresponding to the highest ramp rate and a second curve 166 corresponding to the slowest ramp rate. The minimum amount of time needed to perform a read operation without causing an erase state drift tail for memory cells charged at the highest ramp rate is about 1.36 μs, whereas the minimum amount of time needed to perform a read operation without causing the erase state drift tail for memory cells charged at the lowest ramp rate is about 3.92 μs. This amounts to a difference of about 2.56 μs. In order to achieve a faster read speed (e.g., by at least 2.56 μs), a faster ramp rate control would be beneficial but the peak current would significantly increase as noted by the first sequence waveform 122 during the R2 cycle.

The subject technology provides for reducing the peak current while minimizing the occurrence of injection read disturbs for read operations by providing an asymmetric ramp rate control with respect to the selected word line. For example, the subject technology provides the asymmetric ramp rate control by driving a high ramp rate voltage on selective word lines but driving a low ramp rate voltage on other word lines, thus yielding about a five percent (5%) read performance improvement over traditional ramp rate control approaches and a significant reduction (e.g., about a 44% improvement) in the peak current consumption during a read operation (e.g., read operation clocked by R2 read clock).

Figure 2:
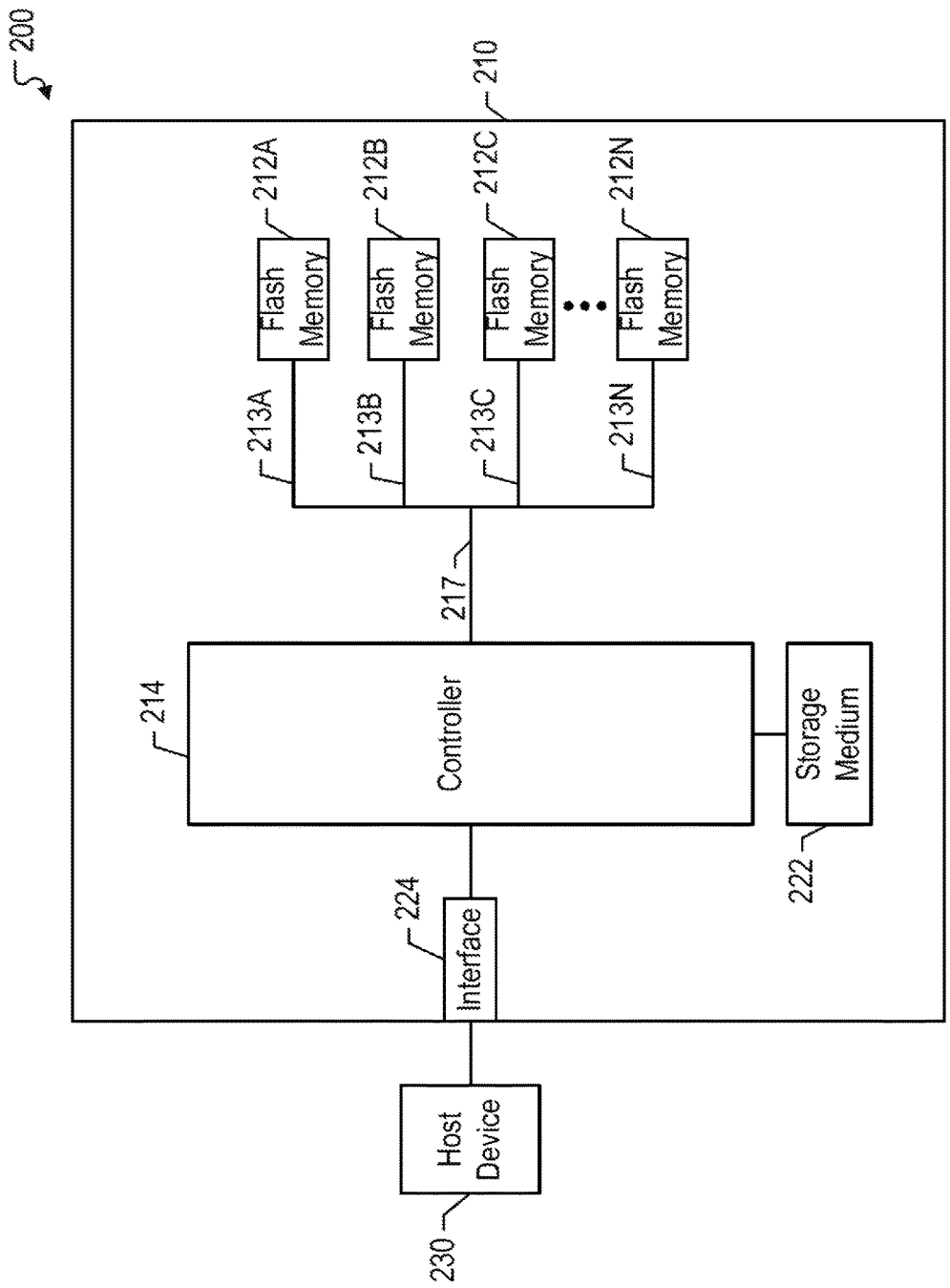
FIG. 2 illustrates an example of a computer system in accordance with one or more implementations.

FIG. 2 illustrates an example data storage system 200 that may implement a system for asymmetric voltage ramp rate control in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The system 200 includes a data storage device 210 and a host device 230. The data storage device 210 includes one or more flash memory circuits 212A-N, one or more channels 213A-N, a controller 214, storage medium 222, an interface 224. The controller 214 may include one or more decoders (not shown), such as error-correcting code (ECC) decoders, one or more encoders (not shown), such as ECC encoders. The one or more decoders and/or the one or more encoders may be one or more dedicated circuits of the controller 214, may be implemented via firmware running on the controller 214, and/or may be one or more circuits separate from the controller 214. As used herein, the term "flash memory" may be used interchangeably with the terms "non-volatile memory circuit" and "flash memory circuit."

The processor of controller 214 may be a general-purpose microprocessor, a multi-core processor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions executed by controller 214 and/or its processor may be stored and read from the storage medium 222 or the one or more flash memory circuits 212A-N, electronic media, optical media, magnetic media, or other type(s) of storage media. These storage media represent examples of tangible and/or non-transitory machine or computer readable media on which instructions/code executable by controller 214 and/or its processor may be stored. In some implementations, the instructions may be received from the host device 230 (for example, via the interface 224).

The storage medium 222 may comprise random access memory (RAM), static random-access memory (SRAM), dynamic random-access memory (DRAM), synchronous dynamic random-access memory (SDRAM), such as DDR3, or any combination thereof. In some aspects, the storage medium 222 is used to temporarily store data and information used to manage data storage system 200. The storage medium 222 may be implemented using a single RAM module or multiple RAM modules. While the storage medium 222 is depicted as being distinct from the controller 214, those skilled in the art would recognize that storage medium 502 may be incorporated into the controller 214 without departing from the scope of the subject technology. Alternatively, the storage medium 222 may be a non-volatile memory such as a magnetic disk, flash memory, peripheral SSD, and the like.

The one or more flash memory circuits 212A-N may include, according to various aspects, one or more flash integrated circuits, Chalcogenide RAM (C-RAM), Phase Change Memory (PCM or PC-RAM), Programmable Metallization Cell RAM (PMCRAM or PMCm), Ovonic Unified Memory (OUM), Resistance RAM (RERAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRRAM), other discrete NVM (non-volatile memory) chips, or any combination thereof. The data storage device 210 may further include other types of nonvolatile and/or volatile storage, such as magnetic storage.

The interface 224 of the data storage device 210 couples the data storage device 210 to the host device 230. The interface 224 may be a wired interface, such as a Peripheral Component Interface Controller (PCIC) interface, a Personal Computer Memory Card International Association (PCMCIA) interface, a Serial AT Attachment (SATA) interface, a universal serial bus (USB) interface, or generally any wired interface. Alternatively, or in addition, the interface 224 may be a wireless interface, such as wireless SATA, Bluetooth, or generally any wireless interface. The interface 224 may be configured to implement only one interface. Alternatively, the interface 224 (and/or the I/O interface of the controller 214) may be configured to implement multiple interfaces, which may be individually selectable using a configuration parameter selected by a user or programmed at the time of assembly. The interface 224 may include one or more buffers for buffering transmissions between the host device 230 and the controller 214.

The channels 213A-N may each communicatively couple one or more of the flash memory circuits 212A-N to the controller 214. In one or more implementations, the channels 213A-N may be directly coupled to the controller 214, e.g. The channels 213A-N may be wired interfaces.

The host device 230 represents any device configured to be coupled to the data storage system 200 and to store data in the data storage system 200. The host device 230 may be a computing system such as a personal computer, a server, a workstation, a laptop computer, PDA, smart phone, and the like. Alternatively, the host device 230 may be an electronic device such as a digital camera, a digital audio player, a digital video recorder, and the like.

In the system 200, the channel 213A is communicatively coupled to the flash memory circuit 212A, the channel 213B is communicatively coupled to the flash memory circuit 212B, the channel 213C is communicatively coupled to the flash memory circuit 212C, and the channel 213N is communicatively coupled to the flash memory circuit 212N. Although the channels 213A-N are illustrated in the system 200 as each being communicatively coupled to one of the flash memory circuits 212A-N, each of the channels 213A-N may be communicatively coupled to multiple of the flash memory circuits 212A-N as is discussed further below with respect to FIG. 2. When multiple of the flash memory circuits 212A-N are coupled to a single one of the channels 213A-N, only one of the flash memory circuits 212A-N may be able to transmit or receive data over the channel at any given time.

Each of the channels 213A-N may be implemented using one or more physical I/O buses coupled between one of the flash memory interfaces and the corresponding flash memory circuit(s). Each channel allows the corresponding flash memory interface to send read, write and/or erase commands to the corresponding flash memory device. Each flash memory interface may include a register (e.g., First-In-First-Out (FIFO) register) that queues read, write and/or erase commands from the controller 214 for the corresponding flash memory device. Although the term "channel," as used above in reference to FIG. 2, may refer to the bus coupled between a flash memory interface and the corresponding flash memory device, the term "channel" may also refer to the corresponding flash memory device that is addressable.

The channels 213A-N may each be associated with a maximum bandwidth and/or throughput. Similarly, the interface 224 may also be associated with a maximum bandwidth and/or throughput. Thus, there may be bandwidth/throughput limitations on the amount of data that can be transferred and/or over each of the channels 213A-N at any given time. Furthermore, each of the flash memory circuits 212A-N may be capable of processing only a single command, e.g. a write command or a read command, at any given time.

The controller 214 may be operable to read data from, and write data to, the flash memory circuits 212A-N via the channels 213A-N. For example, the controller 214 receives data, such as a stream of data, from the host device 230 via the interface 224, where the data may be then written to one or more of the flash memory circuits 212A-N via one or more of the channels 213A-N.

The controller 214 may utilize the storage medium 222 to queue system data and/or host data that are intended to be stored in the flash memory circuits 212A-N. For example, the storage medium 222 may be used as a buffer for rate control, or may otherwise be used to store information (e.g., queues, variables, physical block status, logical to physical address mapping tables, endurance/retention data, settings, etc.) utilized by the controller 214 to read/write data to/from the flash memory circuits 212A-N. Since the storage medium 222 may be volatile memory, the controller 214 may write from the storage medium 222 to the flash memory circuits 212A-N to permanently store information in one or more of the flash memory circuits 212A-N. When the data storage device 210 is powered on, the controller 214 may retrieve the information from the one or more flash memory circuits 212A-N and store the information in the storage medium 222. The storage medium 222 may be part of the controller 214 in some implementations, or the storage medium 222 may be a separate component and communicably coupled to the controller 214 in other implementations.

Storage access commands communicated by the interface 224 may include read and write commands issued by the host device 230. Read and write commands may specify a logical address (e.g., logical block addresses or LBAs) used to access the data storage device 210.

The flash memory circuits 212A-N may each include physical blocks, such as NAND blocks and/or NOR blocks. The physical blocks may each include physical pages to which data may be written to or read from. Although the physical pages of the blocks of the flash memory circuits 212A-N can be individually written to (e.g., a physical page being a unit for read/write operations), the physical pages of a block of the flash memory circuits 212A-N cannot be individually erased. Instead, a page of a block can only be erased, and subsequently rewritten to, by erasing all of the pages of the block (e.g., a block being a unit for erase operations). Thus, as data is moved from a page of a block, or the data is deleted, the page may be marked invalid and cannot be reused until the entire block is erased. The flash memory circuits 212A-N may not be limited to any particular capacity or configuration. For example, the number of physical blocks, the number of physical pages per physical block, the number of sectors per physical page, and the size of the sectors may vary within the scope of the subject technology.

It should be understood that in all cases data may not always be the result of a command received from the host device 230 and/or returned to the host device 230. In some aspects, the controller 214 may be configured to execute a read operation independent of the host device 230 (e.g., to verify read levels or BER). The predicate words "configured to", "operable to", and "programmed to" as used herein do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Figure 3:
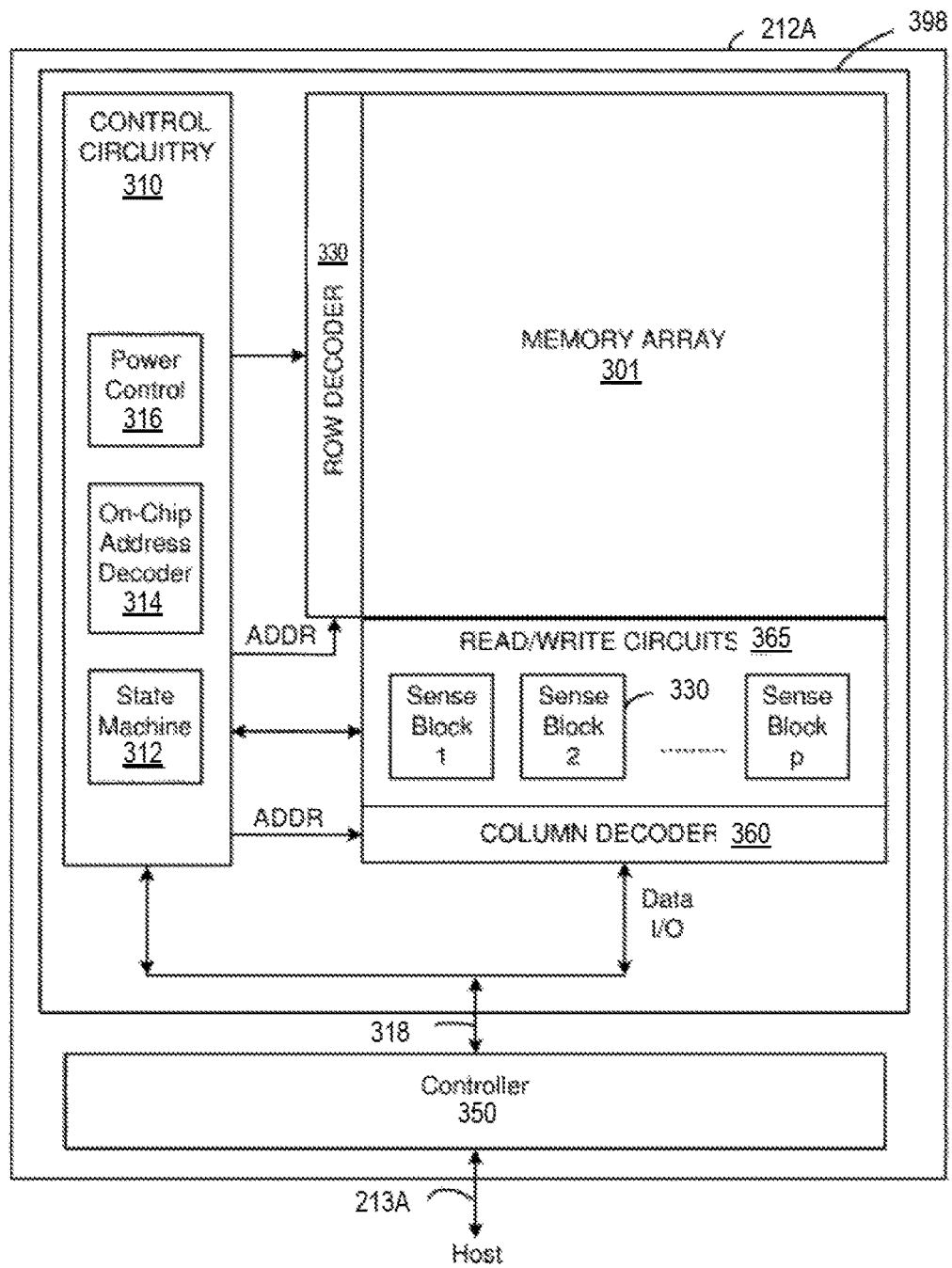
FIG. 3 illustrates an example of a non-volatile storage system including control circuitry for sensing of memory cells in accordance with one or more implementations.

FIG. 3 depicts one implementation of a flash memory circuit (e.g., 212A) including read/write circuits for reading and programming a page (or other unit) of memory cells (e.g., NAND multi-level cells) in parallel. As depicted, the flash memory circuit 212A includes a memory die 398 and a controller 350. The memory die 398 includes a memory array 301 (e.g., a NAND flash memory array), a control circuitry 310, a row decoder 330, a column decoder 360, and read/write circuits 365. In one implementation, access to the memory array 301 by the various peripheral circuits (e.g., row decoders or column decoders) is implemented in a symmetric fashion, on opposite sides of the array, so that the densities of access lines and circuitry on each side are reduced by half. The memory array 301 is addressable by word lines via a row decoder 330 and by bit lines via a column decoder 360. Word lines and bit lines are examples of memory array control lines. The read/write circuits 365 include multiple sense blocks 300 that allow a page of storage elements to be read or programmed in parallel. In some cases, the controller 350 may be integrated on the memory die 398. Commands and data are transferred between the host and controller 350 via channel 213A and between the controller 350 and the memory die 398 via lines 318.

The control circuitry 310 cooperates with the read/write circuits 365 to perform memory operations on the memory array 301. The control circuitry 310 includes a state machine 312, an on-chip address decoder 314, and a power control module 316. The state machine 312 provides chip-level control of memory operations. The on-chip address decoder 314 provides an address interface between the addresses used by the host and the hardware addresses used by the decoders 330 and 360. The power control module 316 controls the power and voltages supplied to the word lines and bit lines during memory operations. In one implementation, a power control module 316 includes one or more charge pumps that may generate voltages greater than the supply voltage.

In some implementations, one or more of the components (alone or in combination), other than memory array 301, may be referred to as a managing or control circuit. For example, one or more managing or control circuits may include any one of or a combination of control circuitry 310, state machine 312, decoders 330/360, power control 316, sense blocks 300, read/write circuits 365, controller 350, and so forth. The one or more managing circuits or the one or more control circuits may perform or facilitate one or more memory array operations including erasing, programming, or reading operations.

In some implementations, one or more managing or control circuits may be used for controlling the operation of a memory array, such as the memory array 301. The one or more managing or control circuits may provide control signals to the memory array in order to perform a read operation and/or a write operation on the memory array. In some aspects, the one or more managing or control circuits may include any one of or a combination of control circuitry, state machine, decoders, sense amplifiers, read/write circuits, and/or controllers. The one or more control circuits may enable or facilitate one or more memory array operations including erasing, programming, or reading operations to be performed on the memory array. In some aspects, the one or more control circuits may comprise an on-chip memory controller for determining row and column addresses, word line and bit line addresses, memory array enable signals, and/or data latching signals.

In one implementation, the memory array 301 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one implementation, a page may be the unit of programming. Other units of programming can also be used. One or more pages of data are typically stored in one row of memory cells. For example, one or more pages of data may be stored in memory cells connected to a common word line. In one implementation, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 4:
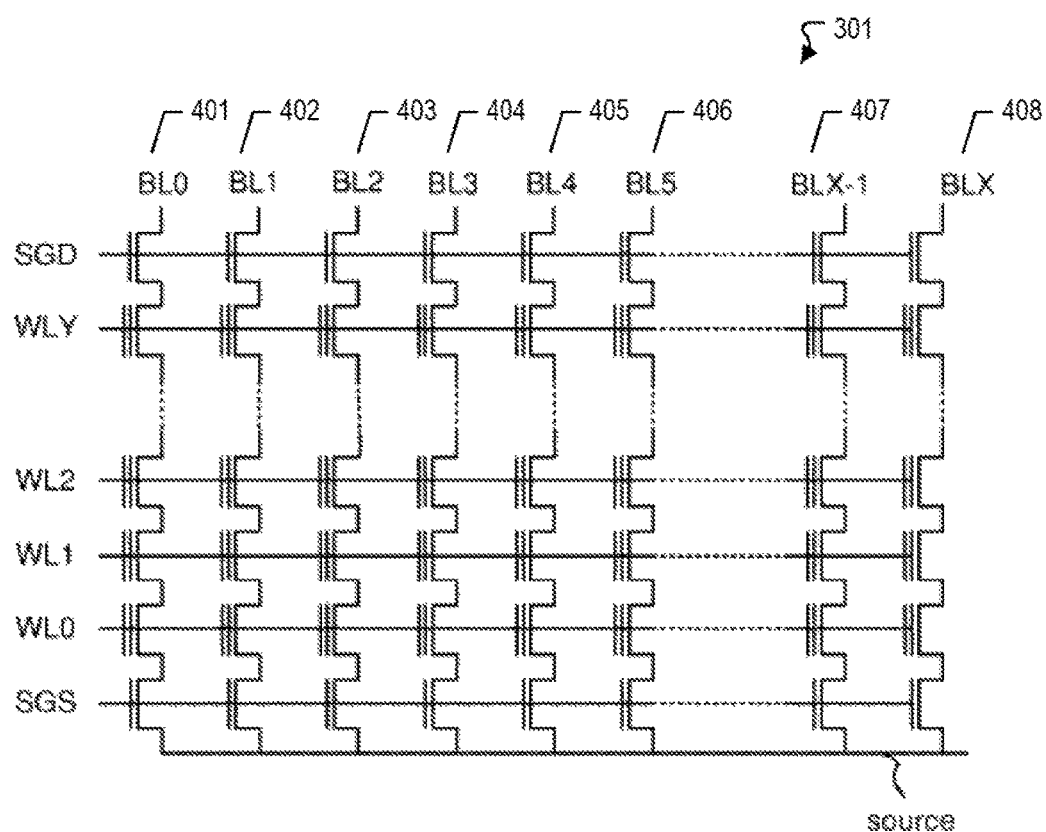
FIG. 4 illustrates an example of a memory block including a multiple NAND strings in accordance with one or more implementations.

FIG. 4 depicts one implementation of a memory block (e.g., the memory array 301) including multiple NAND strings. As depicted, each NAND string includes (Y+1) memory cells. Each NAND string is connected to one bit line out of (X+1) bit lines on the drain side (e.g., one bit line of bit lines BL0-BLX) via a drain-side select gate controlled by the drain-side selection signal SGD. For example, as shown in FIG. 4, the memory array 301 includes bit lines 401 (BL0), 402 (BL1), 403 (BL2), 404 (BL3), 405 (BL4), 406 (BL5), 407 (BLX−1) and 408 (BLX). Each NAND string is connected to a source line (source) via a source-side select gate controlled by source-side selection signal SGS. In one implementation, the source-side select gate controlled by source-side selection signal SGS and the drain-side select gate controlled by the drain-side selection signal SGD may comprise transistors without floating gates or transistors that include a floating gate structure.

In one implementation, during a programming operation, when programming a memory cell, such as a NAND flash memory cell, a program voltage may be applied to the control gate of the memory cell and the corresponding bit line may be grounded. These programming bias conditions may cause electrons to be injected into the floating gate via field-assisted electron tunneling, thereby raising the threshold voltage of the memory cell. The program voltage applied to the control gate during a program operation may be applied as a series of pulses. In some aspects, the magnitude of the programming pulses may be increased with each successive pulse by a predetermined step size. Between programming pulses, one or more verify operations may be performed.

In one implementation, memory cells may be erased by raising the p-well to an erase voltage for a sufficient period of time and grounding the word lines of a selected block of memory cells while the source and bit lines are floating. These erase bias conditions may cause electrons to be transferred from the floating gate through the tunneling oxide, thereby lowering the threshold voltage of the memory cells within the selected block. In some aspects, an erase operation may be performed on an entire memory plane, on individual blocks within a memory plane, or another unit of memory cells.

In some implementations, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. In some cases, during a verify operation, the source line may be set to 0V, to 1V, or to any voltage greater than or less than ground. In one example, during a verify operation, the source line may be set to 1V and the selected word line may be set to 5V. In another example, during a verify operation, the source line may be set to 3V and the selected word line may be set to 2V.

There are many ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

Figure 5A:
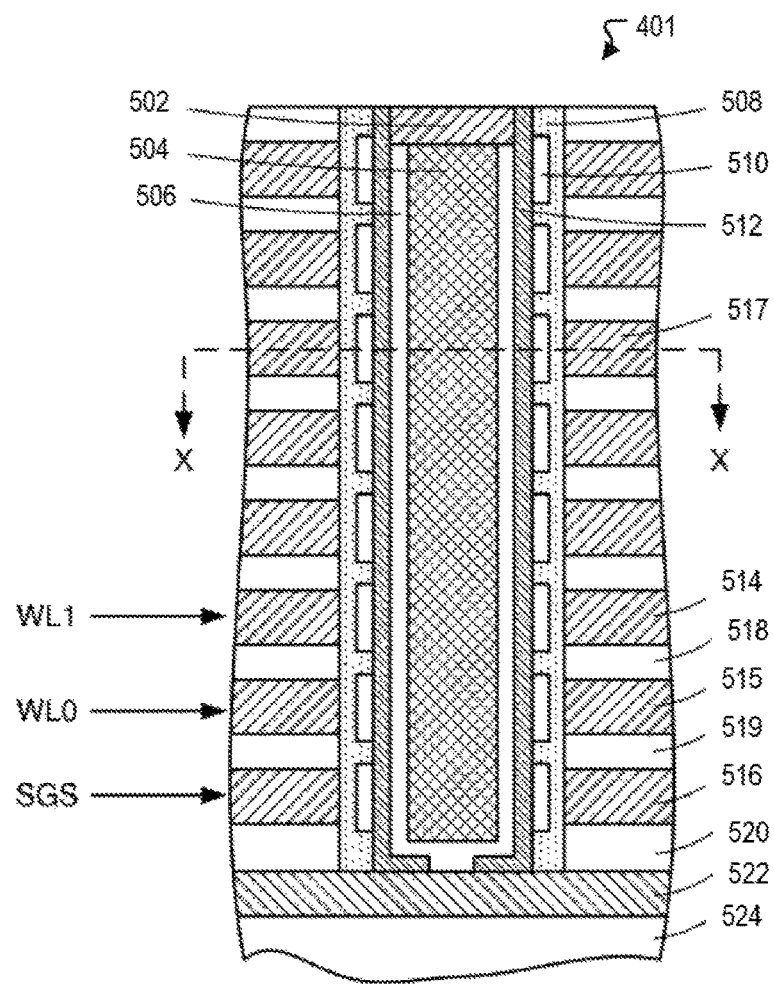
FIG. 5A illustrates an example of a vertical NAND structure in accordance with one or more implementations.

FIG. 5A depicts an implementation of a vertical NAND structure. The vertical NAND structure includes an inverted NAND string formed above a substrate 524 and oriented such that the inverted NAND string is orthogonal to the substrate 524. An inverted NAND string may include a NAND string that includes an inverted floating gate transistor with a tunneling oxide between a floating gate of the inverted floating gate transistor and a control gate of the inverted floating gate transistor. The arrangement of the tunneling oxide between the floating gate and the control gate allows the mechanism (e.g., F-N tunneling as the transport mechanism) for programming and/or erase of the inverted floating gate transistor to occur between the floating gate and the control gate rather than between the floating gate and the channel of the inverted floating gate transistor. The inverted NAND string may be arranged within a vertical memory hole that is etched through alternating layers of control gate material (e.g., tungsten, nitride, or polysilicon) and inter-gate insulator material (e.g., oxide or silicon dioxide). As depicted, the layers of control gate material include layer 517 and layers 514-516 and the layers of inter-gate insulator material include layers 518-520. The inter-gate insulator material layer 520 may be arranged above a source line layer 522 (e.g., doped polysilicon) that may be arranged above the substrate 524 (e.g., a silicon substrate). In some aspects, a first word line (WL1) may correspond with the control gate layer 514, a second word line (WL0) may correspond with the control gate layer 515, and a source-side select gate line (SGS) may correspond with the control gate layer 516.

In some implementations, within the memory hole a tunneling layer material 508 (e.g., including a thin oxide), a floating gate material 510 (e.g., polysilicon), a dielectric layer 512 (e.g., oxide), and a channel layer material 506 (e.g., undoped polysilicon) may be deposited within the memory hole and arranged in order to form the inverted NAND string. As depicted in FIG. 5A, the tunneling layer material 508 is arranged within or inside of the memory hole. The tunneling layer material 508 may include a portion of a multi-layer dielectric stack such as an ONO dielectric stack, which includes alternating layers of silicon dioxide ("O") and silicon nitride ("N"). In some aspects, the tunneling layer material 508 may include a high-K dielectric material (e.g., hafnium-based high-K dielectrics or hafnium oxide) that has a dielectric constant that is greater than that of silicon dioxide. In some aspects, a core material layer 504 (e.g., oxide) may be formed within the memory hole. In other aspects, the core material layer 504 may be omitted. A bit line contact layer 502 may be formed at the top of the memory hole and connect to or directly abut the channel layer material 506. The channel layer material 506 may connect to the source line layer 522 at the bottom of the memory hole. Thus, in this aspect, the bit line contact layer 502 connects to the inverted NAND string at the top of the memory hole and the source line contact layer 522 connects to the inverted NAND string at the bottom of the memory hole. In one or more implementations, a sense line channel may be formed of a channel layer material 506.

In some implementations, the bit line contact layer 502 may include a material of a first conductivity type (e.g., n-type) and the source line contact layer 522 may include a material of a second conductivity type different from the first conductivity type (e.g., p-type). In an aspect, the bit line contact layer 502 may include an n-type material (e.g., n-type polysilicon) and the source line contact layer 522 may include a p-type material (e.g., p-type polysilicon). In another aspect, the bit line contact layer 502 may include a p-type material and the source line contact layer 522 may include an n-type material (e.g., n-type polysilicon). Thus, in some aspects, the inverted NAND string may include an asymmetric source and drain that may be used to provide both an electron supply (via the n-type material) and a hole supply (via the p-type material) for memory operations (e.g., program, erase, and read operations) performed using the inverted NAND string. The memory operations may include n-channel operations and/or p-channel operations depending on the bias conditions applied to the inverted NAND string.

In some implementations, an inverted NAND string may be formed using a core material layer (e.g., an oxide layer or other dielectric layer) that is arranged adjacent to a channel layer (e.g., an undoped polysilicon channel layer) that is arranged adjacent to a blocking layer (e.g., an oxide layer or other dielectric layer) that is arranged adjacent to a floating gate layer (or a charge trap layer) that is arranged adjacent to a tunneling layer (e.g., a thin oxide) that is arranged adjacent to a control gate layer (e.g., tungsten). The tunneling layer may have a thickness that is less than the thickness of the blocking layer.

Figure 5B:
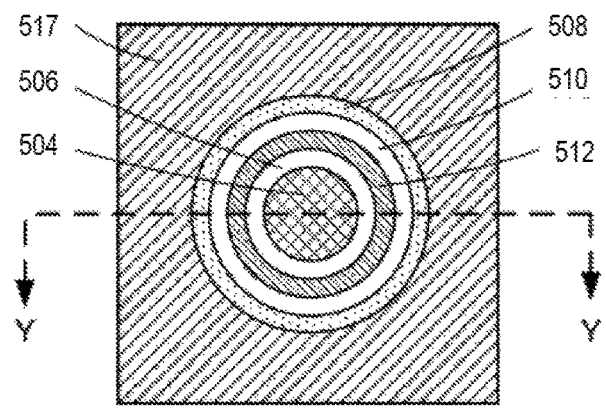
FIG. 5B illustrates a cross-sectional view of the vertical NAND structure along line X-X of FIG. 5A in accordance with one or more implementations.

FIG. 5B depicts an implementation of a cross-sectional view taken along line X-X of FIG. 5A. As depicted, the inverted NAND string includes an inner core material layer 504 that is surrounded by the channel layer material 506 that is surrounded by the dielectric layer 512 that is surrounded by the floating gate material 510 that is surrounded by the tunneling layer material 508 that is surrounded by the control gate material layer 517. In one implementation, FIG. 5A may depict a cross-sectional view taken along line Y-Y of FIG. 5B. In one implementation, the inverted NAND string may be formed using a vertical cylindrical structure or a vertical tapered cylindrical structure. In this case, the dielectric material 512, floating gate material 510, tunneling layer material 508, and channel layer material 506 of the inverted NAND string may comprise vertical annular structures surrounding the core material layer 504. In another implementation, the inverted NAND string may be formed using a vertical pillar structure or a vertical rectangular prism structure.

In some implementations, a vertical NAND structure may include a vertical NAND string formed above a substrate (e.g., 524) and oriented such that the vertical NAND string is orthogonal to the substrate. The vertical NAND string may be arranged within a vertical memory hole that is etched through alternating layers of control gate material (e.g., tungsten or polysilicon) and inter-gate insulator material (e.g., oxide or silicon oxide).

Figure 6A:
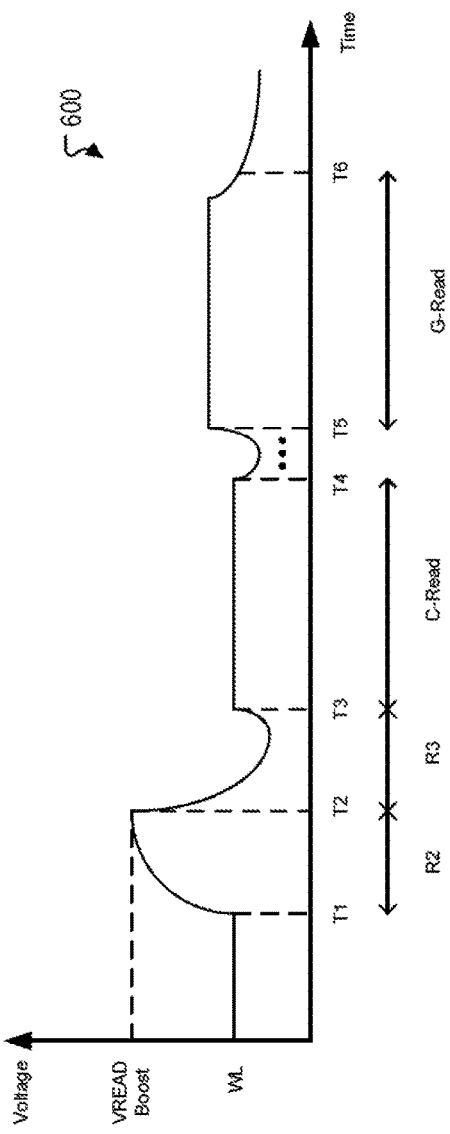
FIG. 6A illustrates an example of a timing waveform of a sensing operation in accordance with one or more implementations.

FIG. 6A illustrates an example of a timing waveform 600 of a sensing operation in accordance with one or more implementations. The timing waveform 600 may be a representation of read operations for a given word line over time. In some implementations, the timing waveform 600 may depict a coding scheme of a lower page read (e.g., A-read, E-read), a middle page read (e.g., B-read, D-read, F-read), an upper page read (C-read, G-read), or any combination thereof. As shown in FIG. 6A, the timing waveform 600 includes a first cycle (e.g., R2) between times T1 and T2, a second cycle (e.g., R3) between times T2 and T3, a third cycle (e.g., C-Read) between times T3 and T4, and a fourth cycle (e.g., G-Read) between times T5 and T6. The timing waveform 600 also includes a representation of elapsed time between times T4 and T5, where other read operations may take place.

In the first cycle (e.g., R2), the word line may be driven to a target pre-read voltage VREAD (e.g., 8V) that boosts the voltages of memory cells on the word line. The R2 cycle may be a period when memory cells on different word lines are collectively ramped up prior to any reading. During the R3 cycle, the memory cells are allowed to ramp down (or discharge) and settle to a second target voltage prior to performing a data read operation. In the third cycle (e.g., C-Read), a data read operation is performed with a memory cell that has a threshold voltage corresponding to the C state. In this respect, the word line for the memory cell is driven with a read voltage corresponding to the C state. Other read operations can follow such as the data read operation performed with a memory cell having a threshold voltage corresponding to the G state during the fourth cycle. In this respect, the word line for the memory cell is driven with a read voltage corresponding to the G state (e.g., 5 V).

Figure 6B:
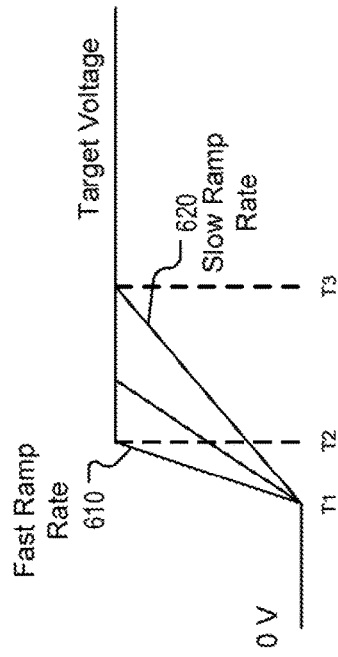
FIG. 6B illustrates an example of voltage transition waveforms with different ramp rates in accordance with one or more implementations.

FIG. 6B illustrates an example of voltage transition waveforms with different ramp rates in accordance with one or more implementations. The voltage transition waveforms (e.g., 610, 620) include examples of raising the voltage on a first set of word lines at a faster rate (e.g., 610) than raising the voltage on the second set of word lines (e.g., 620). The voltage on both the first and second sets of word lines starts to increase towards the target voltage (e.g., VREAD). However, the voltage on the first set of word lines increases at a faster rate than the voltage on the second set of word lines. The rate of increase may be measured in terms of volts per unit time.

In some implementations, the ramping of the pre-read voltages is performed at a constant rate. Thus, the ramp rate may be defined as the slope of the voltage waveform from the start of the ramp to the end of the ramp. For example, for the first set of word lines, the ramp rate is defined by: VREAD/(time T2–time T1). For the second set of word lines, the ramp rate is defined by: VREAD/(time T3–time T1). The slope (or ramp rate) for ramping up the first word lines is greater than the slope for ramping up the second word lines in this embodiment.

Figure 6C:
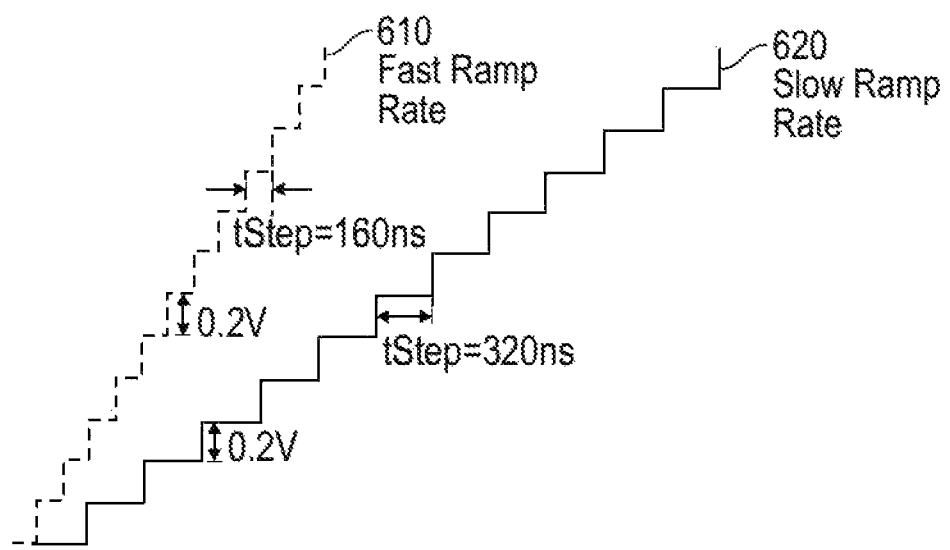
FIG. 6C conceptually illustrates an example of discrete step voltages with fast and slow ramp rates in accordance with one or more implementations.

FIG. 6C conceptually illustrates an example of discrete step voltages with fast and slow ramp rates in accordance with one or more implementations. In some implementations, the ramp rate may be defined as the slope of the voltage waveform from the start of the ramp to the end of the ramp, where the ramp is comprised of multiple discrete step voltages with a magnitude and step duration. The step duration for the higher ramp rate may be about 160 ns, whereas the step duration for the lower ramp rate may be about 320 ns. The ramp rate is defined by: (step magnitude)/(step duration, tStep). In some implementations, the discrete step voltages for each of the higher ramp rate and the lower ramp rate have a same step magnitude (e.g., 0.2V). For the first set of word lines, the ramp rate is defined by: 0.2V/160 ns. For the second set of word lines, the ramp rate is defined by: 0.2V/320 ns. The slope (or ramp rate) for ramping up the first word lines is greater than the slope for ramping up the second word lines in this embodiment. In some implementations, the step duration for fast ramp rates may be in a range of 80 ns to 160 ns, whereas the step duration for slow ramp rates may be in a range of 240 ns to 640 ns. In some implementations, the step magnitude for the higher ramp rate and lower ramp rate may be different. In some examples, the discrete step voltages for the higher ramp rate and lower ramp rate may increase with different step magnitudes but are increased to the same target voltage.

In some implementations, the pre-read voltages may not be ramped up at a constant rate. For example, the slope of the voltage waveform on the first and second sets of word lines may change over time. For example, initially the slope may be quite steep, with the slope decreasing as the voltage nears the target voltage value (e.g., VREAD). The slope can be defined as an "instantaneous slope," which refers to the slope of the voltage waveform at one instant in time. The slope can also be defined as an "average slope," which refers to the slope of the voltage waveform between two points in time. The average slope may depend on which two points in time are selected. The rate at which a pre-read voltage is ramped is defined herein as the average slope from the time the pre-read voltage first starts to ramp up to when the pre-read voltage reaches its final value.

In some implementations, the average slope of a voltage waveform, such as the voltage waveform applied to the first and second sets of word lines in FIGS. 6B and 6C, may be generated using a voltage regulator. The average slope of the voltage waveform may be generated using a configurable RC network at the output of the voltage regulator or using a tunable resistor or transistor in series with the voltage regulator. In one example, the tunable resistor may be adjusted or set such that the average slope of the output voltage waveform from the voltage regulator matches the average slope of the desired voltage waveform. In some implementations, the voltage waveform may be generated using a voltage regulator in which an internal regulation point within the voltage regulator or a node within the voltage regulator through which closed-loop feedback is used to generate the desired voltage waveform may be adjusted over time using a predetermined waveform schedule (e.g., stored in a non-volatile memory) in order to generate the desired voltage waveform with the desired average slope. The output of the voltage regulator may be buffered (e.g., using a unity gain buffer) prior to driving one or more word lines (e.g., prior to driving the two neighboring unselected word lines that are adjacent to the selected word line.

Figure 7A:
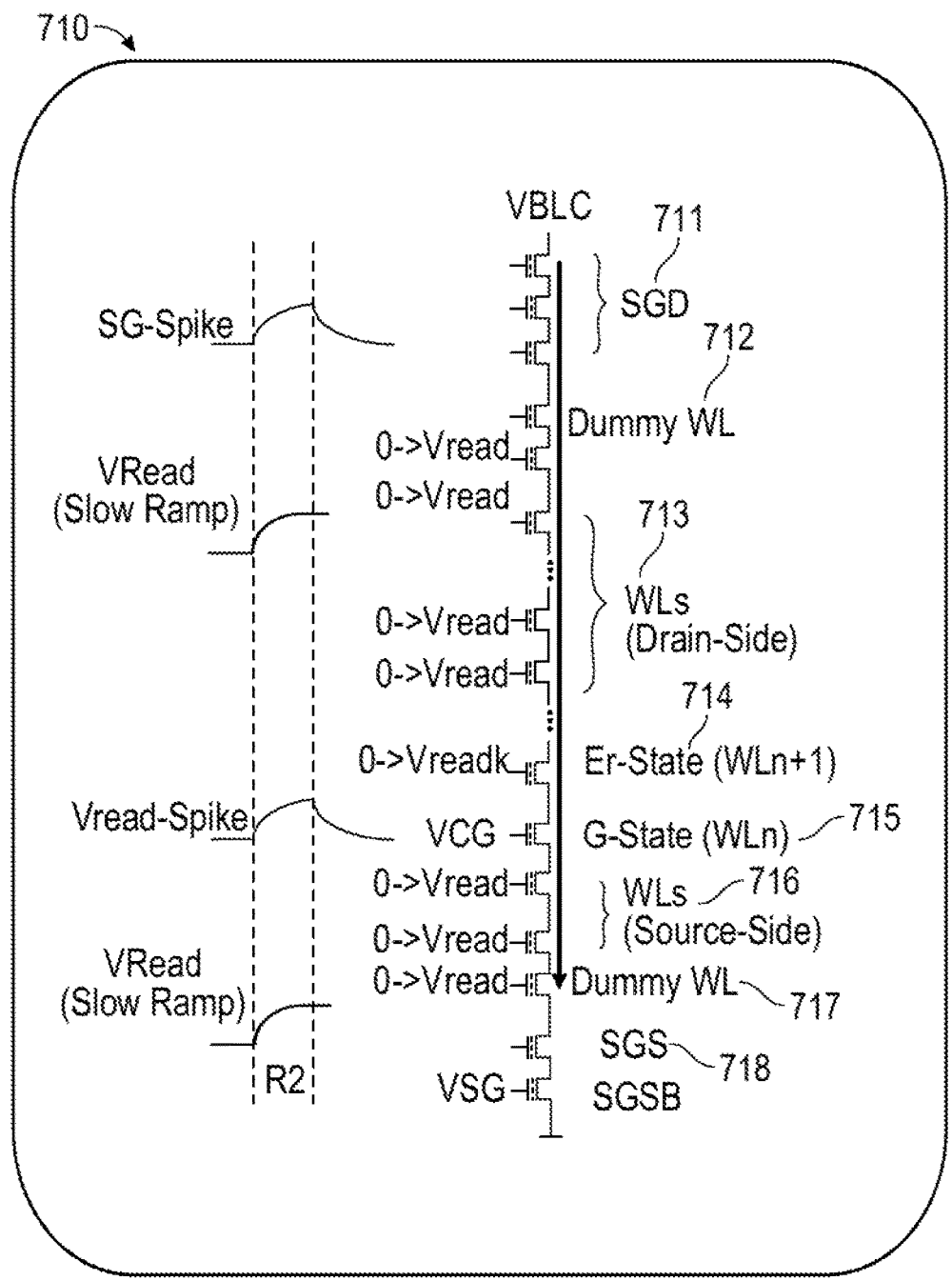
FIG. 7A illustrates an example of a NAND string with word lines collectively ramped up to a read voltage during a read operation with ramp rate control disabled to memory cells of the NAND string in accordance with one or more implementations.

FIG. 7A illustrates an example of a NAND string 710 with word lines collectively ramped up to a read voltage during a read operation with ramp rate control disabled to memory cells of the NAND string in accordance with one or more implementations. In FIG. 7A, the word line voltages are at VREAD, consistent with T2 in FIG. 6B. The memory string 401 and its channel of FIG. 4 are depicted. The NAND string 710 includes an SGD transistor 711, drain-side dummy memory cell 712, drain-side data memory cells 713, a Vreadk memory cell 714 connected to WLn+1, a selected memory cell 715 connected to WLn, source side data memory cells 716, a source-side dummy memory cell 717, and an SGS transistor 718. Further, each transistor has a threshold voltage (Vth) and a control gate voltage. In this example, the SGS transistor 718 has Vth=0 V and 8 V on the control gate, the dummy memory cell 717 has Vth=4 V and 8 V on the control gate, the dummy memory cell 712 has Vth=0 V and 8 V on the control gate, the Vreadk memory cell 714 has Vth=0 V (e.g., it is in the erased state) and 8 V on the control gate, and the data memory cell 715 has Vth=5 V (e.g., it is in the G state) and 8 V on the control gate. The data memory cells 713 and 716 may have Vth=5 V and 8 V on the control gate.

As discussed above, when the pre-read voltage (e.g., VREAD) ramp rate is fast (or steep slope), the peak current exceeds a target current value for power management. In particular, when the pre-read voltage ramp rate is fast, both source-side and drain-side word lines can quickly ramp up to the target voltage (e.g., VREAD) in the R2 cycle. In this respect, the bit line channel is conducting from both source and drain sides with respect to the selected word line (e.g., WLn). In this example, the likelihood of an injection read disturb occurrence on the adjacent word line (e.g., WLn+1) is relatively low, if not negligible. In some aspects, the value of VREAD with the fast ramp rate may be in a range of 7V to 9V at the end of the R2 cycle. Similarly, the values of SG-spike and Vread-spike may be in a range of 7V to 8V at the end of the R2 cycle.

As depicted in FIG. 7A, the control gate voltages are ramped up with the higher ramp rate such that the applied ramp rate control allows the control gates to reach the target voltage within the time duration of the R2 cycle. At this time, the data and dummy memory cells are in a conductive state, e.g., the control gate voltage exceeds the Vth of the cell. The bit line channel will be conductive along its length. Vcelsrc=0 V may be applied at the source end of the string while Vblc=0 V is applied at the drain end of the string. Moreover, residue electrons are present in the channel. These electrons remain after a sensing operation in the NAND string 710, in which a current passes through the channel.

Figure 7B:
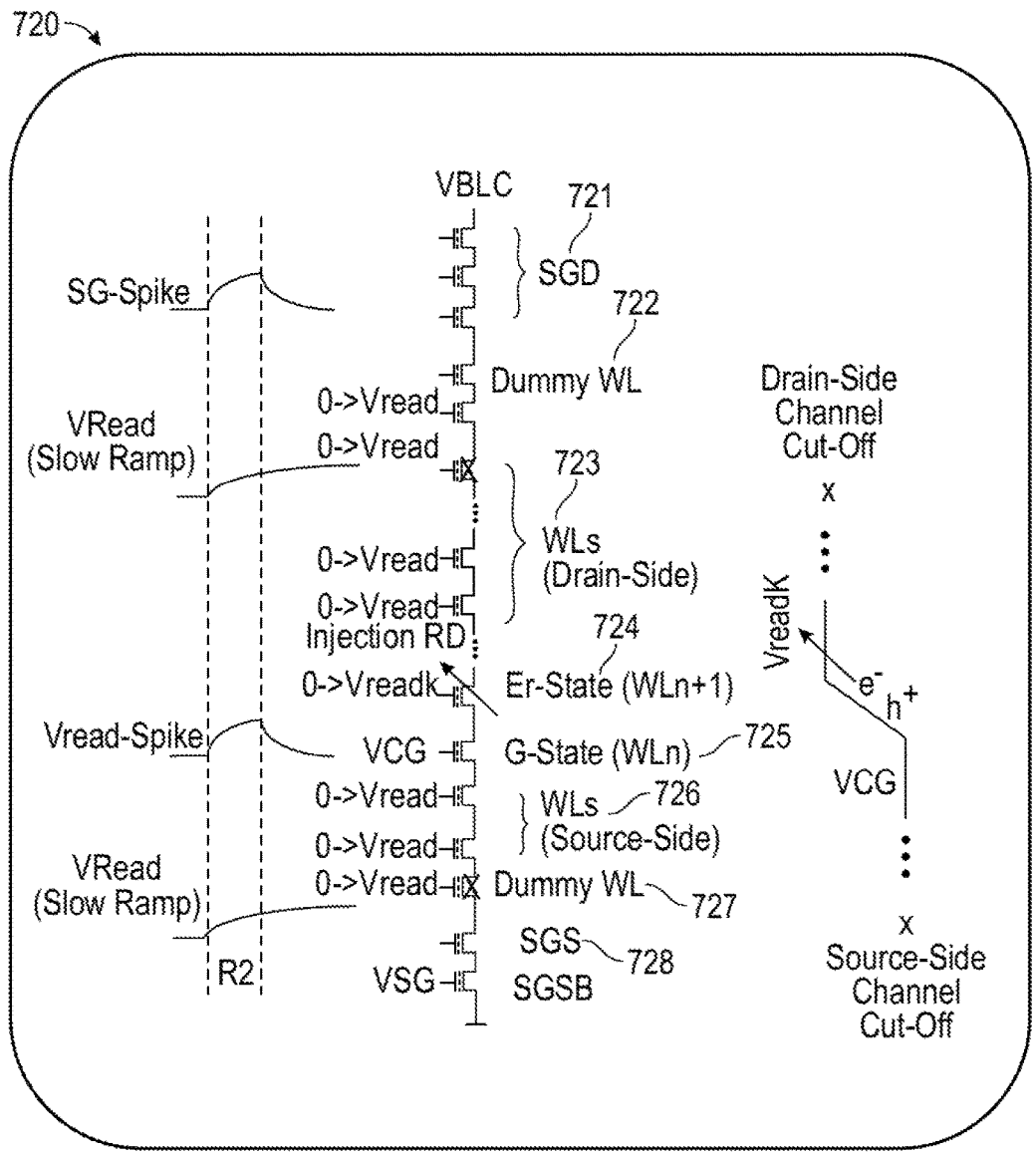
FIG. 7B illustrates an example of a NAND string with word lines collectively ramped up to a read voltage during a read operation with ramp rate control enabled to memory cells of the NAND string in accordance with one or more implementations.

FIG. 7B illustrates an example of a NAND string 720 with word lines collectively ramped up to a read voltage during a read operation with ramp rate control enabled to memory cells of the NAND string in accordance with one or more implementations. In FIG. 7B, the word line voltages are at VREAD, consistent with T3 in FIG. 6B. The memory string 401 and its channel of FIG. 4 are depicted. The NAND string 720 includes an SGD transistor 721, drain-side dummy memory cell 722, drain-side data memory cells 723, an adjacent memory cell 724 connected to WLn+1, a selected memory cell 725 connected to WLn, source side data memory cells 726, a source-side dummy memory cell 727, and an SGS transistor 728.

As discussed above, when the pre-read voltage (e.g., VREAD) ramp rate is low (or gradual slope), the peak current does not exceed the target current value for power management. In some aspects, the value of VREAD with the slow ramp rate may be in a range of 4V to 6V at the end of the R2 cycle. On the other hand, the values of SG-spike and Vread-spike may be in a range of 7V to 8V at the end of the R2 cycle.

In particular, when the pre-read voltage ramp rate is low, both source-side and drain-side word lines cannot quickly ramp up to the target voltage (e.g., VREAD) in the R2 cycle. In this respect, this causes a channel cut-off from both source and drain sides with respect to the selected word line (e.g., WLn). For example, a channel cut-off on the drain side includes all of the data memory cells and dummy memory cells on the drain side not conducting. Similarly, a channel cut-off on the source side includes all of the data memory cells and dummy memory cells on the source side not conducting. In this respect, a channel cut-off from both source and drain sides includes all data memory cells and dummy memory cells on both drain and source sides not conducting. This channel cut-off may generally be referred to as a "floating channel." As a result, a large potential gradient creates electron-hole generation and electrons can inject into the adjacent word line (e.g., WLn+1), thus resulting in a relatively large erase state drift tail to form (see FIG. 1C). In this example, the likelihood of an injection read disturb occurrence on the adjacent word line (e.g., WLn+1) is significantly high.

When the word lines on the data memory cells 723 and the dummy memory cell 722 are charged with the pre-read voltage at the lower ramp rate, the drain-side portion of the bit line channel becomes non-conductive because the pre-read voltage does not the exceed the threshold voltage of these memory cells within the R2 cycle. Similarly, when the word lines on the data memory cells 726 and the dummy memory cell 727 are charged with the pre-read voltage at the lower ramp rate, the source-side portion of the bit line channel becomes non-conductive because the pre-read voltage does not the exceed the threshold voltage of these memory cells within the R2 cycle. In this example, the Vreadk memory cell 724 is ramped up with the lower ramp rate. The channel region of the memory cell 725 is then brought down to a level of about 0-Vth or −4V. This relatively low level will carry over to an adjacent channel region of the Vreadk memory cell 724, such as at a level of −4 V, so that a significant channel gradient (e.g., 12V) is created between the Vreadk memory cell 724 and the selected memory cell 725. This channel gradient generates electron-hole pairs, as represented by electrons (denoted by "e'") and holes (denoted by "h+"). The electrons can be injected into the adjacent memory cell 724, causing a read disturb.

FIG. 8A illustrates an example of a NAND string with word lines collectively ramped up to a read voltage during a read operation with ramp rate control enabled to a first subset of memory cells of the NAND string in accordance with one or more implementations of the subject technology. In FIG. 8A the source-side word line voltages on a first subset of memory cells are at VREAD, consistent with T2 in FIG. 6B. The memory string 401 and its channel of FIG. 4 are depicted. The NAND string 810 includes an SGD transistor 811, drain-side dummy memory cell 812, drain-side data memory cells 813, an adjacent memory cell 814 connected to WLn+1, a selected memory cell 815 connected to WLn, source side data memory cells 816, a source-side dummy memory cell 817, and an SGS transistor 818. In some implementations, the value of VREAD during the R2 cycle may be in a range of 7V to 9V to turn on the memory cells. In some aspects, the voltage used to bias the word line of the dummy memory cells (e.g., 812, 817) during the R2 cycle may be in a range of 7V to 8V.

As depicted in FIG. 8A, the NAND string 810 includes raising the voltage on a first set of word lines (e.g., 816) at a faster rate than raising the voltage on a second set of word lines (e.g., 813). In some embodiments, the NAND string 810 includes a channel layer (e.g., the channel layer material 506), a first set of memory cells (e.g., 816), a second set of memory cells (e.g., 813) and a charge device (e.g., 316). The first set of memory cells are in a first location (e.g., source side) relative to a selected memory cell (e.g., 815). In some aspects, the selected memory cell 815 is selected for sensing. A sensing operation may occur, for example, during a program verify operation or a reading operation. In some aspects, the first set of memory cells includes a first portion of the channel layer (e.g., between memory cell 814 and SGS transistor 818). The second set of memory cells are in a second location (e.g., drain side) relative to the selected memory cell 815. In some aspects, the second set of memory cells include a second portion of the channel layer (e.g., between memory cell 814 and SGD transistor 811). The charge device is configured to charge the first set of memory cells to a first magnitude (e.g., VREAD) and charge the second set of memory cells to a second magnitude (e.g., VREAD). In some aspects, the first set of memory cells is charged at a rate differently from that of the second set of memory cells. For example, the first set of memory cells are ramped up with the higher ramp rate because the first set of memory cells includes the lesser amount of word lines among the two sets of memory cells in the NAND string 810.

The higher ramp rates of the voltages on unselected word lines for the first set of memory cells (having the lesser amount of memory cells) can enable the first portion of the bit line channel to conduct from the source side. The lower ramp rates of the voltages on unselected word lines for the second set of memory cells (having the greater amount of memory cells) can help lower the amount of peak current generated during the pre-read cycle (e.g., R2 cycle). However, in this example, there is a channel cut-off on the drain side that includes, among others, all of the data memory cells (e.g., 813) and dummy memory cells (e.g., 812) on the drain side not conducting. Although the first portion of the bit line channel would not conduct from the drain side, the change in potential between the selected word line and the drain-side adjacent word lines would not be sufficient to cause an injection read disturb occurrence in the Vreadk memory cell 814 (e.g., connected to the word line WLn+1).

In some implementations, the first set of memory cells is charged to the first magnitude faster than the second set of memory cells charged to the second magnitude when a number of the first set of memory cells is less than a number of the second set of memory cells. In some implementations, the second set of memory cells is charged to the second magnitude faster than the first set of memory cells charged to the first magnitude when a number of the first set of memory cells is greater than a number of the second set of memory cells. In some implementations, the first portion of the channel layer is conductive when a number of the first set of memory cells is less than a number of the second set of memory cells. In some implementations, the second portion of the channel layer is conductive when the number of the first set of memory cells is greater than the number of the second set of memory cells.

In some implementations, the charge device (e.g., 310) includes a first ramp rate circuit (e.g., 316) configured to drive the first set of memory cells to a first voltage at a first ramp rate, and a second ramp rate circuit (e.g., 316) configured to drive the second set of memory cells to a second voltage at a second ramp rate different from the first ramp rate. In some implementations, the first ramp rate is less than the second ramp rate when a number of the first set of memory cells is greater than a number of the second set of memory cells. In some implementations, the first ramp rate is greater than the second ramp rate when a number of the first set of memory cells is less than a number of the second set of memory cells. In some implementations, the first portion of the channel layer is conductive when the first ramp rate is greater than the second ramp rate. In some implementations, the second portion of the channel layer is conductive when the second ramp rate is greater than the first ramp rate.

In some implementations, the charge device drives a first voltage signal with a first ramp rate. In some aspects, the NAND string 810 includes a ramp rate control circuit configured to receive the first voltage signal and produce a second voltage signal with a second ramp rate less than the first ramp rate. In some implementations, the ramp rate control circuit may be realized with an RC network. In some aspects, the first set of memory cells is charged with the first voltage signal when a number of the first set of memory cells is less than a number of the second set of memory cells. In some aspects, the first set of memory cells is charged with the second voltage signal when the number of the first set of memory cells is greater than the number of the second set of memory cells.

In some implementations, the charge device is configured to drive the first set of memory cells with a first plurality of discrete step voltages and drive the second set of memory cells with a second plurality of discrete step voltages. In some aspects, each of the first plurality of discrete step voltages has a first duration and each of the second plurality of discrete step voltages has a second duration different from the first duration. In some implementations, the first duration is greater than the second duration when a number of the first set of memory cells is greater than a number of the second set of memory cells. For example, the first duration may be about 320 ns, whereas the second duration may be about 160 ns. In some implementations, the first duration is less than the second duration when a number of the first set of memory cells is less than a number of the second set of memory cells. For example, the first duration may be about 160 ns, whereas the second duration may be about 320 ns.

In some implementations, each of the first plurality of discrete step voltages has a first magnitude and each of the second plurality of discrete step voltages has a second magnitude that corresponds to the first magnitude. For example, the magnitude of each step for both ramp rates may be set to about 0.2 V, however, the magnitude value is arbitrary and may be a different value depending on implementation.

In some embodiments, the NAND string 810 includes a first set of memory cells on a first side (e.g., source side) of a memory cell selected for reading (e.g., memory cell 815) and a second set of memory cells on a second side (e.g., drain side) of the memory cell. The NAND string 810 also includes control circuitry (e.g., 310) configured to drive a first voltage signal to ramp up a voltage of the first set of memory cells and a voltage of the second set of memory cells. In some aspects, the control circuitry produces a second voltage signal from the first voltage signal. In some aspects, the first set of memory cells is ramped up with the first voltage signal at a first ramp rate and the second set of memory cells is ramped up with the second voltage signal at a second ramp rate different from the first ramp rate. As used herein, the term "ramp up" may refer to a magnitude increase regardless of polarity (i.e., an absolute value).

In some embodiments, the NAND string 810 includes an array of memory cells that includes one or more first memory cells, a memory cell, and one or more second memory cells. The system also includes a plurality of word lines coupled to the array of memory cells. In some aspects, the plurality of word lines include a first set of word lines coupled to the one or more first memory cells (e.g., 816) and a second set of word lines coupled to the one or more second memory cells (e.g., 813). The system also includes a plurality of bit lines (e.g., 401-408) coupled to the array of memory cells. The system also includes a controller (e.g., 310) coupled to the array of memory cells. In some aspects, when the memory cell is selected for a read operation, the controller is configured to charge the first set of word lines with a first plurality of discrete step voltages (e.g., 610, 620), charge a control line of the memory cell, charge the second set of word lines with a second plurality of discrete step voltages (e.g., 610, 620), and read one or more signals from the plurality of bit lines. In some aspects, each of the first plurality of discrete step voltages has a first duration and each of the second plurality of discrete step voltages has a second duration different from the first duration.

In some implementations, the first duration is greater (e.g., slow ramp rate) than the second duration (e.g., fast ramp rate) when a number of the one or more first memory cells is greater than a number of the one or more second memory cells. In some implementations, the first duration is less (e.g., fast ramp rate) than the second duration (e.g., slow ramp rate) when a number of the one or more first memory cells is less than a number of the one or more second memory cells. In some implementations, each of the first plurality of discrete step voltages has a first magnitude and each of the second plurality of discrete step voltages has a second magnitude that corresponds to the first magnitude (e.g., 0.2V).

In some embodiments, the NAND string 810 includes first ramp rate circuitry as a means for increasing a first control voltage at a first control rate on one or more control lines to one or more first memory cells. The NAND string 810 also includes second ramp rate circuitry as a means for increasing a second control voltage at a second control rate on one or more control lines to one or more second memory cells. In some aspects, the first control rate is less than the second control rate when a number of the one or more first memory cells is greater than a number of the one or more second memory cells.

FIG. 8B illustrates an example of a NAND string with word lines collectively ramped up to a read voltage during a read operation with ramp rate control enabled to a second subset of memory cells of the NAND string in accordance with one or more implementations of the subject technology. In FIG. 8B the drain-side word line voltages on a second subset of memory cells are at VREAD, consistent with T2 in FIG. 6B. The memory string 401 and its channel of FIG. 4 are depicted. The NAND string 820 includes an SGD transistor 821, drain-side dummy memory cell 822, drain-side data memory cells 823, an adjacent memory cell 824 connected to WLn+1, a selected memory cell 825 connected to WLn, source side data memory cells 826, a source-side dummy memory cell 827, and an SGS transistor 828.

As depicted in FIG. 8B, the NAND string 820 includes raising the voltage on the second set of word lines (e.g., 823) at a faster rate than raising the voltage on the first set of word lines (e.g., 826). In this example, the second set of memory cells are ramped up with the higher ramp rate because the second set of memory cells includes the lesser amount of word lines among the two sets of memory cells in the NAND string 820.

The higher ramp rates of the voltages on unselected word lines for the second set of memory cells (having the lesser amount of memory cells) can enable the second portion of the bit line channel to conduct from the drain side. The lower ramp rates of the voltages on unselected word lines for the first set of memory cells (having the greater amount of memory cells) can help lower the amount of peak current generated during the pre-read cycle (e.g., R2 cycle). However, in this example, there is a channel cut-off on the source side that includes, among others, all of the data memory cells (e.g., 826) and dummy memory cells (e.g., 827) on the source side not conducting. Although the first portion of the bit line channel would not conduct from the source side, the change in potential between the selected word line and the adjacent word lines would not be sufficient to cause an injection read disturb occurrence in the Vreadk memory cell 824 (e.g., connected to the word line WLn+1).

Figure 9A:
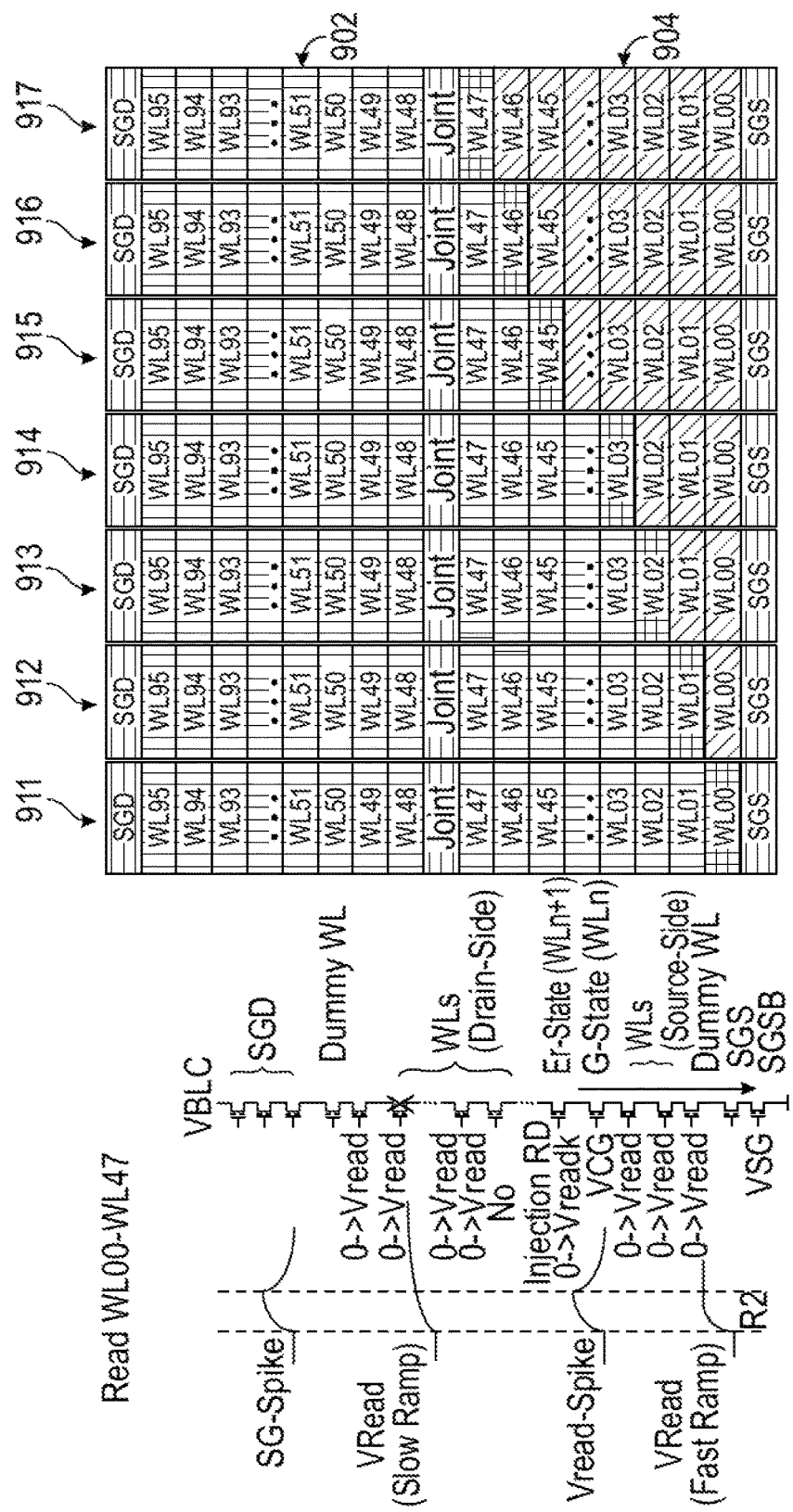
FIG. 9A illustrates an example of an asymmetric distribution of different ramp rates applied to an array of memory cells in accordance with one or more implementations of the subject technology.

FIG. 9A illustrates an example of an asymmetric distribution of different ramp rates applied to an array of memory cells in accordance with one or more implementations of the subject technology. For example, during a word line read operation, source-side word lines (e.g., WL0–WLn−1) and drain-side word lines (e.g., WLn+1–WL95) are ramped up differently. In this example, if the word line address is less than a predetermined word line address (e.g., WL48), then the source-side word lines are ramped up fast (e.g., RRC=0.3×), but drain-side word lines are ramped up slow (e.g., RRC=1×).

As illustrated in FIG. 9A, the NAND string 810 is depicted alongside a tabulation of word lines for different bias configurations within a block (e.g., 911-917). For example, element 911 represents a bias configuration within a block when WL00 is being sensed. In another example, element 912 represents a bias configuration within a block when WL01 is being sensed. In another example, element 913 represents a bias configuration within a block when WL02 is being sensed. In another example, element 914 represents a bias configuration within a block when WL03 is being sensed. In another example, element 915 represents a bias configuration within a block when WL45 is being sensed. In another example, element 916 represents a bias configuration within a block when WL46 is being sensed. In another example, element 917 represents a bias configuration within a block when WL47 is being sensed.

The tabulation includes a designation for word lines driven with a voltage at the high ramp rate (e.g., 904, illustrated by the slant line pattern) and word lines driven with a voltage at the low ramp rate (e.g., 902, illustrated by the vertical line pattern). For a given word line selected for sensing (e.g., denoted as WL02 in bit line 913, illustrated by the checkered line pattern), the number of word lines located on either side of the selected word line is used to determine which ramp rate is applied to each side. For example, as shown in FIG. 9A, the number of drain-side word lines for any given bit line is greater than the number of source-side word lines such that the source-side word lines are driven with a voltage at the higher ramp rate. This is because driving a fewer amount of word lines at the higher ramp rate helps maintain read performance timing while reducing the peak current during the R2 cycle. Additionally, only the source-side channel is conducting from the source (e.g., VCELSRC), thus no large potential gradient is formed in the drain-side adjacent word line (thereby suppressing any injection read disturb in the drain-side channel).

Figure 9B:
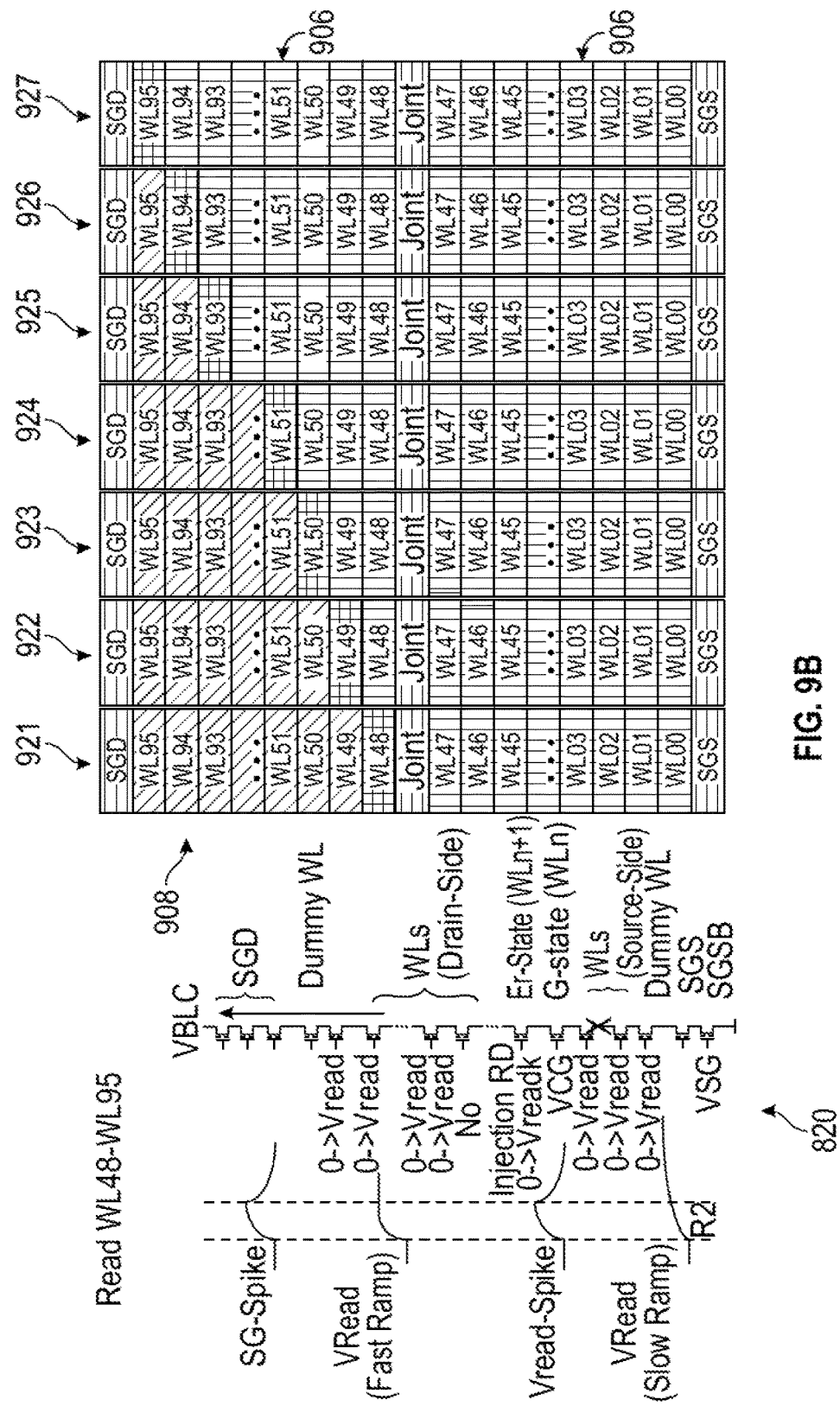
FIG. 9B illustrates another example of an asymmetric distribution of different ramp rates applied to the array of memory cells in accordance with one or more implementations of the subject technology.

FIG. 9B illustrates another example of the asymmetric distribution of different ramp rates applied to the array of memory cells in accordance with one or more implementations of the subject technology. As illustrated in FIG. 9B, the NAND string 820 is depicted alongside a tabulation of word lines for different bias configurations within a block (e.g., 921-927). For example, element 921 represents a bias configuration within a block when WL48 is being sensed. In another example, element 922 represents a bias configuration within a block when WL49 is being sensed. In another example, element 923 represents a bias configuration within a block when WL50 is being sensed. In another example, element 924 represents a bias configuration within a block when WL51 is being sensed. In another example, element 925 represents a bias configuration within a block when WL93 is being sensed. In another example, element 926 represents a bias configuration within a block when WL94 is being sensed. In another example, element 927 represents a bias configuration within a block when WL95 is being sensed.

The tabulation includes a designation for word lines driven with a voltage at the high ramp rate (e.g., 908, illustrated by the slant line pattern) and word lines driven with a voltage at the low ramp rate (e.g., 906, illustrated by the vertical line pattern). In this example, if the word line address is greater than a predetermined word line address (e.g., WL48, illustrated by the checkered line pattern), then the source-side word lines are ramped up slow (e.g., RRC=1×), but drain-side word lines are ramped up fast (e.g., RRC=0.3×). In FIG. 9B, only the drain-side channel is conducting from the drain (e.g., VBLC), thus no large potential gradient is formed in the source-side adjacent word line (thereby suppressing any injection read disturb in the source-side channel). In some aspects, the VBLC voltage during the R2 cycle may be in a range of 0.2V to 0.5V.

Figure 10A:
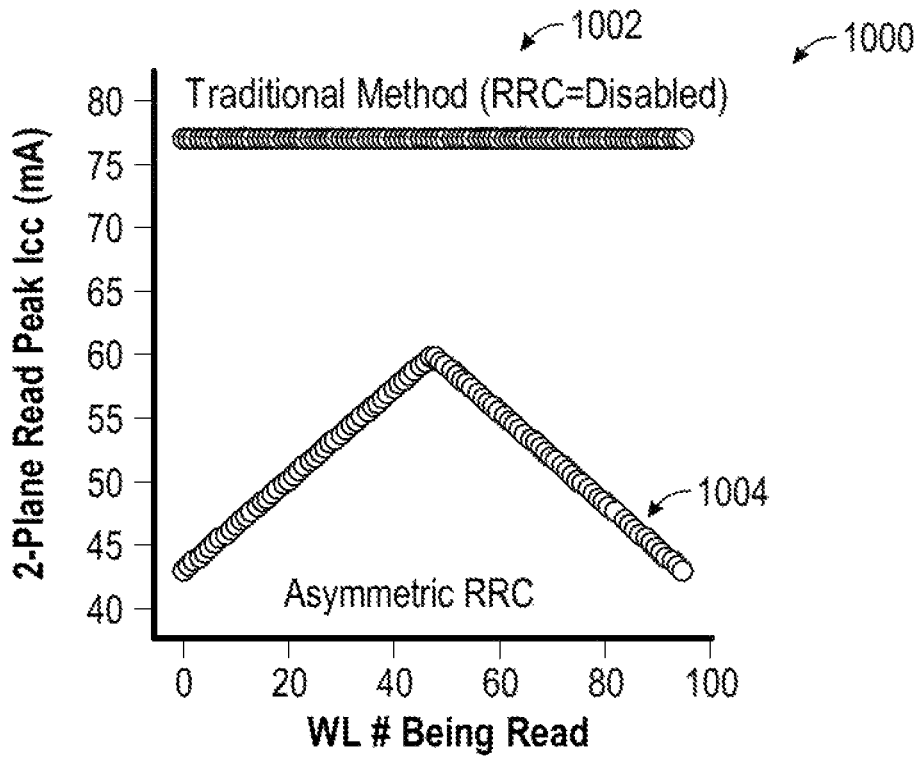
FIG. 10A conceptually illustrates a plot depicting device peak current as a function of a word line address in accordance with one or more implementations of the subject technology.

FIG. 10A conceptually illustrates a plot 1000 depicting device peak current as a function of a word line address in accordance with one or more implementations of the subject technology. In the plot 1000, the y-axis represents the 2-plane read operation peak current in terms of milliamps, and the x-axis represents the word line address selected for reading. In view of the tabulations of FIGS. 9A and 9B, the peak current is lowest on either the lowest word line address (e.g., WL01 in FIG. 9A) or the highest word line address (e.g., WL94 in FIG. 9B). This is because a first set of memory cells having the lesser amount of memory cells (relative to the selected word line) is driven with the voltage at the higher ramp rate and a second set of memory cells having the greater amount of memory cells (relative to the selected word line) is driven with the voltage at the lower ramp rate, which altogether facilitates in reducing the peak current during the R2 read cycle.

Figure 10B:
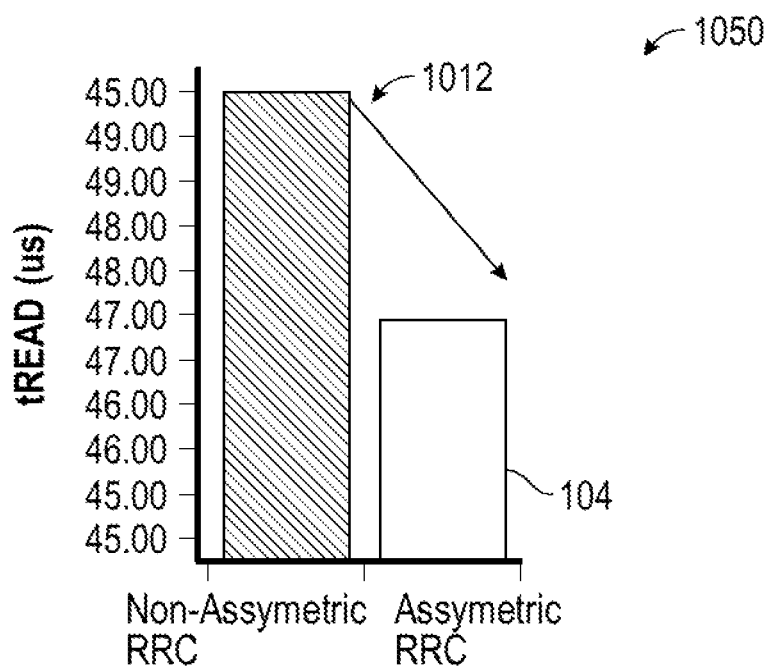
FIG. 10B conceptually illustrates a plot depicting a comparison between read timing for a symmetric application of ramp rate control and read timing for an asymmetric application of ramp rate control in accordance with one or more implementations of the subject technology.

FIG. 10B conceptually illustrates a plot 1050 depicting a comparison between read timing for a symmetric application of ramp rate control and read timing for an asymmetric application of ramp rate control in accordance with one or more implementations of the subject technology. The amount of read timing duration required without causing a decline in read performance for a non-asymmetric distribution of ramp rate control (e.g., 1052) is relatively greater than the amount of read timing duration needed for an asymmetric distribution of ramp rate control (e.g., 1054). In particular, the asymmetric ramp rate control yields about a five percent (5%) improvement in timing, which translates to about 2.5 μs faster than the non-asymmetric ramp rate control.

Figure 11:
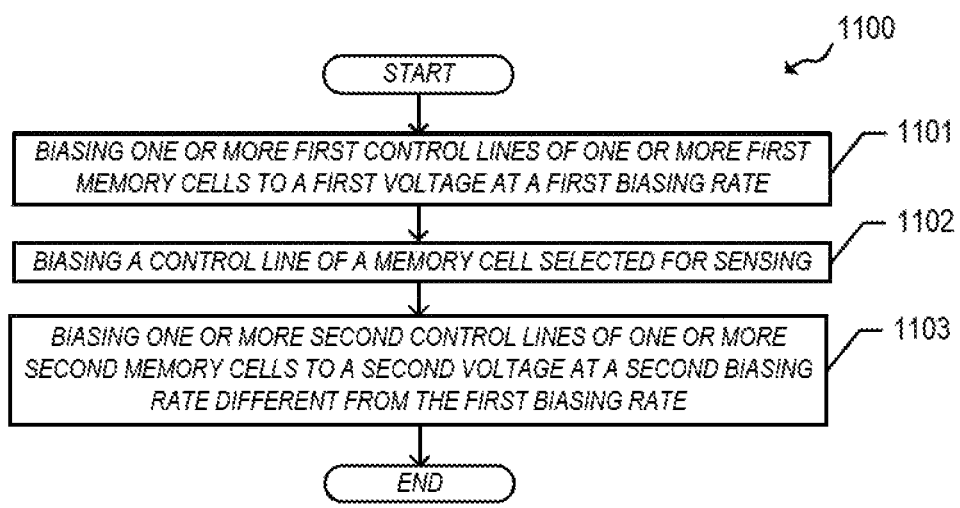
FIG. 11 illustrates a process for asymmetric voltage ramp rate control in accordance with one or more implementations of the subject technology.

FIG. 11 illustrates an example process 1100 of automated motion capture data processing using the example data storage system 800 of FIG. 8A. For explanatory purposes, the blocks of the example process 1100 are described herein as occurring in serial, or linearly. However, multiple blocks of the example process 1100 may occur in parallel. In addition, the blocks of the example process 1100 need not be performed in the order shown and/or one or more of the blocks of the example process 1100 need not be performed.

The process 1100 starts at step 1101, where a control circuitry biases one or more first control lines of one or more first memory cells to a first voltage at a first biasing rate. Next, at step 1102, the control circuitry biases a control line of a memory cell selected for sensing. Subsequently, at step 1103, the control circuitry biases one or more second control lines of one or more second memory cells to a second voltage at a second biasing rate different from the first biasing rate.

In some implementations, the process 1100 includes a step for biasing the one or more first control lines with a first plurality of discrete step voltages to ramp up the one or more first memory cells to the first voltage at the first biasing rate. In some implementations, the process 1100 includes a step for biasing the one or more second control lines with a second plurality of discrete step voltages to ramp up the one or more second memory cells to the second voltage at the second biasing rate. In some aspects, each of the first plurality of discrete step voltages has a first duration and each of the second plurality of discrete step voltages has a second duration different from the first duration. In some implementations, the first duration is greater than the second duration when a number of the one or more first memory cells is greater than a number of the one or more second memory cells. In some implementations, the first duration is less than the second duration when a number of the one or more first memory cells is less than a number of the one or more second memory cells.

In some implementations, the process 1100 includes a step for producing the second voltage from the first voltage using a ramp rate control circuit coupled to the one or more second memory cells. In some aspects, the first biasing rate is greater than the second biasing rate when a number of the one or more first memory cells is less than a number of the one or more second memory cells. In some aspects, the first biasing rate is less than the second biasing rate when the number of the one or more first memory cells is greater than the number of the one or more second memory cells.

As discussed above, the subject technology provides for reducing device peak current during a read operation by charging word lines of a first set of memory cells faster than word lines of a second set of memory cells while minimizing the channel gradient formed adjacent to the selected word line to suppress the occurrence of an injection read disturb in the bit line channel.

In one embodiment of the subject technology, an apparatus includes a first set of memory cells in a first location relative to a selected memory cell selected for sensing. The apparatus also includes a second set of memory cells in a second location relative to the selected memory cell. The apparatus also includes a sense line channel configured to couple the selected memory cell to the first set of memory cells and the second set of memory cells. The apparatus also includes a charge device that is configured to charge the first set of memory cells and the second set of memory cells. In some aspects, a rate of charging the first set of memory cells is different from a rate of charging the second set of memory cells.

In one embodiment of the subject technology, an apparatus includes a first set of memory cells on a first side of a memory cell selected for reading and a second set of memory cells on a second side of the memory cell. The apparatus also includes control circuitry configured to ramp up a first voltage signal at a first ramp rate on the first set of memory cells and ramp up a second voltage signal at a second ramp rate on the second set of memory cells, wherein the second voltage signal is based on the first voltage signal, and wherein the first ramp rate is different from the second ramp rate.

In one embodiment of the subject technology, a system includes an array of memory cells comprising a first set of memory cells, a memory cell, and a second set of memory cells. The system also includes a plurality of word lines coupled to the array of memory cells. In some aspects, the plurality of word lines comprising a first set of word lines coupled to the first set of memory cells and a second set of word lines coupled to the second set of memory cells. The system also includes a plurality of bit lines coupled to the array of memory cells. The system also includes a controller coupled to the array of memory cells. In some aspects, when the memory cell is selected for a read operation, the controller is configured to charge the first set of word lines with a first plurality of discrete step voltages, charge a control line of the memory cell, and charge the second set of word lines with a second plurality of discrete step voltages. In some aspects, each of the first plurality of discrete step voltages has a first duration and each of the second plurality of discrete step voltages has a second duration different from the first duration.

In one embodiment of the subject technology, a method includes biasing one or more first control lines of one or more first memory cells to a first voltage at a first biasing rate. The method includes biasing a control line of a memory cell selected for sensing. The method also includes biasing one or more second control lines of one or more second memory cells to a second voltage at a second biasing rate different from the first biasing rate.

In one embodiment of the subject technology, a non-volatile memory includes means for increasing a first control voltage at a first control rate on one or more control lines to one or more first memory cells. The non-volatile memory also includes means for driving a memory cell selected for reading. The non-volatile memory also includes means for increasing a second control voltage at a second control rate on one or more control lines to one or more second memory cells. In some aspects, the first control rate is less than the second control rate when a number of the one or more first memory cells is greater than a number of the one or more second memory cells.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FjG, and Millipede memory.

Further, the computer-readable storage medium can include any non-semiconductor memory, such as optical disk storage, magnetic disk storage, magnetic tape, other magnetic storage devices, or any other medium capable of storing one or more instructions. In some implementations, the tangible computer-readable storage medium can be directly coupled to a computing device, while in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can vary significantly without varying the underlying logic, function, processing, and output.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuit itself.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as an aspect, the aspect, another aspect, some aspects, one or more aspects, an implementation, the implementation, another implementation, some implementations, one or more implementations, an implementation, the implementation, another implementation, some implementations, one or more implementations, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase (s) may provide one or more examples. A phrase such as an aspect or some aspects may refer to one or more aspects and vice versa, and this applies similarly to other foregoing phrases.

The word "exemplary" is used herein to mean "serving as an example, instance, or illustration." Any implementation described herein as "exemplary" or as an "example" is not necessarily to be construed as preferred or advantageous over other implementations. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. An apparatus, comprising:
    a first set of memory cells in a first location relative to a selected memory cell selected for sensing;
    a second set of memory cells in a second location relative to the selected memory cell;
    a sense line channel configured to couple the selected memory cell to the first set of memory cells and the second set of memory cells; and
    a biasing device configured to bias the first set of memory cells and the second set of memory cells, wherein a rate of biasing the first set of memory cells is different from a rate of biasing the second set of memory cells.

2. The apparatus of claim 1, wherein the biasing device is configured to charge the first set of memory cells faster than charging the second set of memory cells when a number of the first set of memory cells is less than a number of the second set of memory cells.

3. The apparatus of claim 1, wherein the sense line channel comprises a channel portion in the first location, wherein the channel portion in the first location is conductive when a number of the first set of memory cells is less than a number of the second set of memory cells.

4. The apparatus of claim 1, wherein the sense line channel comprises a channel portion in the second location, wherein the channel portion in the second location is conductive when a number of the first set of memory cells is greater than a number of the second set of memory cells.

5. The apparatus of claim 1, wherein the biasing device comprises:
    a first ramp rate circuit configured to drive the first set of memory cells to a first voltage at a first ramp rate; and
    a second ramp rate circuit configured to drive the second set of memory cells to a second voltage at a second ramp rate different from the first ramp rate.

6. The apparatus of claim 5, wherein the first ramp rate is less than the second ramp rate when a number of the first set of memory cells is greater than a number of the second set of memory cells.

7. The apparatus of claim 1, wherein the biasing device is configured to drive a first voltage signal with a first ramp rate, wherein the apparatus further comprises a ramp rate control circuit configured to receive the first voltage signal and to produce a second voltage signal with a second ramp rate less than the first ramp rate, wherein the biasing device is configured to charge the first set of memory cells to the first voltage signal when a number of the first set of memory cells is less than a number of the second set of memory cells, and wherein the ramp rate control circuit is configured to charge the first set of memory cells to the second voltage signal when the number of the first set of memory cells is greater than the number of the second set of memory cells.

8. The apparatus of claim 1, wherein the biasing device is configured to:
    drive the first set of memory cells with a first plurality of discrete step voltages; and
    drive the second set of memory cells with a second plurality of discrete step voltages,
    wherein each of the first plurality of discrete step voltages has a first duration and each of the second plurality of discrete step voltages has a second duration different from the first duration.

9. The apparatus of claim 8, wherein the first duration is greater than the second duration when a number of the first set of memory cells is greater than a number of the second set of memory cells.

10. The apparatus of claim 8, wherein each of the first and second plurality of discrete step voltages has a same magnitude.

11. An apparatus, comprising:
    a first set of memory cells on a first side of a memory cell selected for reading;
    a second set of memory cells on a second side of the memory cell; and
    control circuitry configured to ramp up a first voltage signal at a first ramp rate on the first set of memory cells and ramp up a second voltage signal at a second ramp rate on the second set of memory cells when the memory cell is selected for reading, wherein the second voltage signal is based on the first voltage signal, and wherein the first ramp rate is different from the second ramp rate.

12. The apparatus of claim 11, wherein the first ramp rate is less than the second ramp rate when a number of the first set of memory cells is greater than a number of the second set of memory cells.

13. A system, comprising:
    an array of memory cells comprising a first set of memory cells, a memory cell, and a second set of memory cells;
    a plurality of word lines coupled to the array of memory cells, the plurality of word lines comprising a first set of word lines coupled to the first set of memory cells and a second set of word lines coupled to the second set of memory cells;
    a plurality of bit lines coupled to the array of memory cells;
    a controller coupled to the array of memory cells, wherein when the memory cell is selected for a read operation, the controller is configured to:
        charge the first set of word lines with a first plurality of discrete step voltages;
        charge a control line of the memory cell; and
        charge the second set of word lines with a second plurality of discrete step voltages,
        wherein each of the first plurality of discrete step voltages has a first duration, and each of the second plurality of discrete step voltages has a second duration different from the first duration.

14. The system of claim 13, wherein the first duration is greater than the second duration when a number of the first set of memory cells is greater than a number of the second set of memory cells.

15. The system of claim 13, wherein each of the first and second plurality of discrete step voltages has a same magnitude.

16. A method, comprising:
    biasing one or more first control lines of one or more first memory cells to a first voltage at a first biasing rate;
    biasing a control line of a memory cell selected for sensing; and
    biasing one or more second control lines of one or more second memory cells to a second voltage at a second biasing rate different from the first biasing rate.

17. The method of claim 16, wherein the biasing the one or more first control lines comprises biasing the one or more first control lines with a first plurality of discrete step voltages to ramp up the one or more first memory cells to the first voltage at the first biasing rate, wherein the biasing the one or more second control lines comprises biasing the one or more second control lines with a second plurality of discrete step voltages to ramp up the one or more second memory cells to the second voltage at the second biasing rate, and wherein each of the first plurality of discrete step voltages has a first duration, and each of the second plurality of discrete step voltages has a second duration different from the first duration.

18. The method of claim 17, wherein the first duration is greater than the second duration when a number of the one or more first memory cells is greater than a number of the one or more second memory cells.

19. The method of claim 16, the method further comprising:
generating the second voltage based on the first voltage using a ramp rate control circuit coupled to the one or more second memory cells, wherein the first biasing rate is greater than the second biasing rate when a number of the one or more first memory cells is less than a number of the one or more second memory cells, and wherein the first biasing rate is less than the second biasing rate when the number of the one or more first memory cells is greater than the number of the one or more second memory cells.

20. A non-volatile memory, comprising:
means for increasing a first control voltage at a first control rate on one or more control lines to one or more first memory cells;
means for driving a memory cell selected for reading; and
means for increasing a second control voltage at a second control rate on one or more control lines to one or more second memory cells,
wherein the first control rate is less than the second control rate when a number of the one or more first memory cells is greater than a number of the one or more second memory cells.

* * * * *